(12) United States Patent
Tsuchida et al.

(10) Patent No.: US 12,417,875 B2
(45) Date of Patent: Sep. 16, 2025

(54) ELECTRONIC DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Masahiro Tsuchida, Nisshin (JP); Akihiro Yamaguchi, Nisshin (JP); Ryota Kojima, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 863 days.

(21) Appl. No.: 17/555,594

(22) Filed: Dec. 20, 2021

(65) Prior Publication Data

US 2022/0301762 A1    Sep. 22, 2022

(30) Foreign Application Priority Data

Mar. 16, 2021 (JP) .................. 2021-042664
Jul. 21, 2021 (JP) .................. 2021-120694

(51) Int. Cl.
*H01F 27/28* (2006.01)
*H01F 27/24* (2006.01)
*H05K 1/11* (2006.01)

(52) U.S. Cl.
CPC ......... *H01F 27/2876* (2013.01); *H01F 27/24* (2013.01); *H01F 27/2804* (2013.01); *H05K 1/115* (2013.01); *H01F 2027/2809* (2013.01)

(58) Field of Classification Search
CPC .. H01F 27/2876; H01F 27/24; H01F 27/2804; H01F 2027/2809
USPC ............................................. 336/61
See application file for complete search history.

(56) References Cited

U.S. PATENT DOCUMENTS

| | | | |
|---|---|---|---|
| 2010/0164670 A1* | 7/2010 | Nakahori | H01F 27/306 336/200 |
| 2012/0195005 A1 | 8/2012 | Asano et al. | |
| 2015/0183456 A1 | 7/2015 | Nishimura | |
| 2016/0035480 A1 | 2/2016 | Hachiya et al. | |
| 2016/0035481 A1 | 2/2016 | Hachiya et al. | |
| 2019/0180923 A1 | 6/2019 | Nakajima et al. | |
| 2019/0320554 A1 | 10/2019 | Nakajima et al. | |

FOREIGN PATENT DOCUMENTS

| | | | | |
|---|---|---|---|---|
| JP | 2007059839 A | * | 3/2007 | |
| JP | 2008177486 A | * | 7/2008 | |
| JP | 2010153724 A | * | 7/2010 | ......... H01F 27/2804 |
| JP | 2011077328 A | * | 4/2011 | |
| JP | 2013062355 A | * | 4/2013 | |

(Continued)

*Primary Examiner* — Shawki S Ismail
*Assistant Examiner* — Joselito S. Baisa
(74) *Attorney, Agent, or Firm* — Posz Law Group, PLC

(57) ABSTRACT

An electronic device has a substrate, a signal wiring and a heat radiating wiring. The substrate has one surface and the other surface opposite to the one surface. The signal wiring is formed on an insulating layer of the substrate. The heat radiating wiring is formed on the insulating layer and thermally connected to the signal wiring on a same plane as the signal wiring.

11 Claims, 22 Drawing Sheets

(56) References Cited

FOREIGN PATENT DOCUMENTS

| | | | | |
|---|---|---|---|---|
| JP | 2014036033 A | * | 2/2014 | |
| JP | 2015018857 A | | 1/2015 | |
| JP | 2015-079778 A | | 4/2015 | |
| JP | 2018-186596 A | | 11/2018 | |
| JP | 2019-165148 A | | 9/2019 | |
| KR | 20190072729 A | * | 6/2019 | |
| WO | WO-2011010491 A1 | * | 1/2011 | ............. H01F 27/22 |
| WO | WO-2014141672 A1 | * | 9/2014 | ............. H01F 27/22 |

* cited by examiner

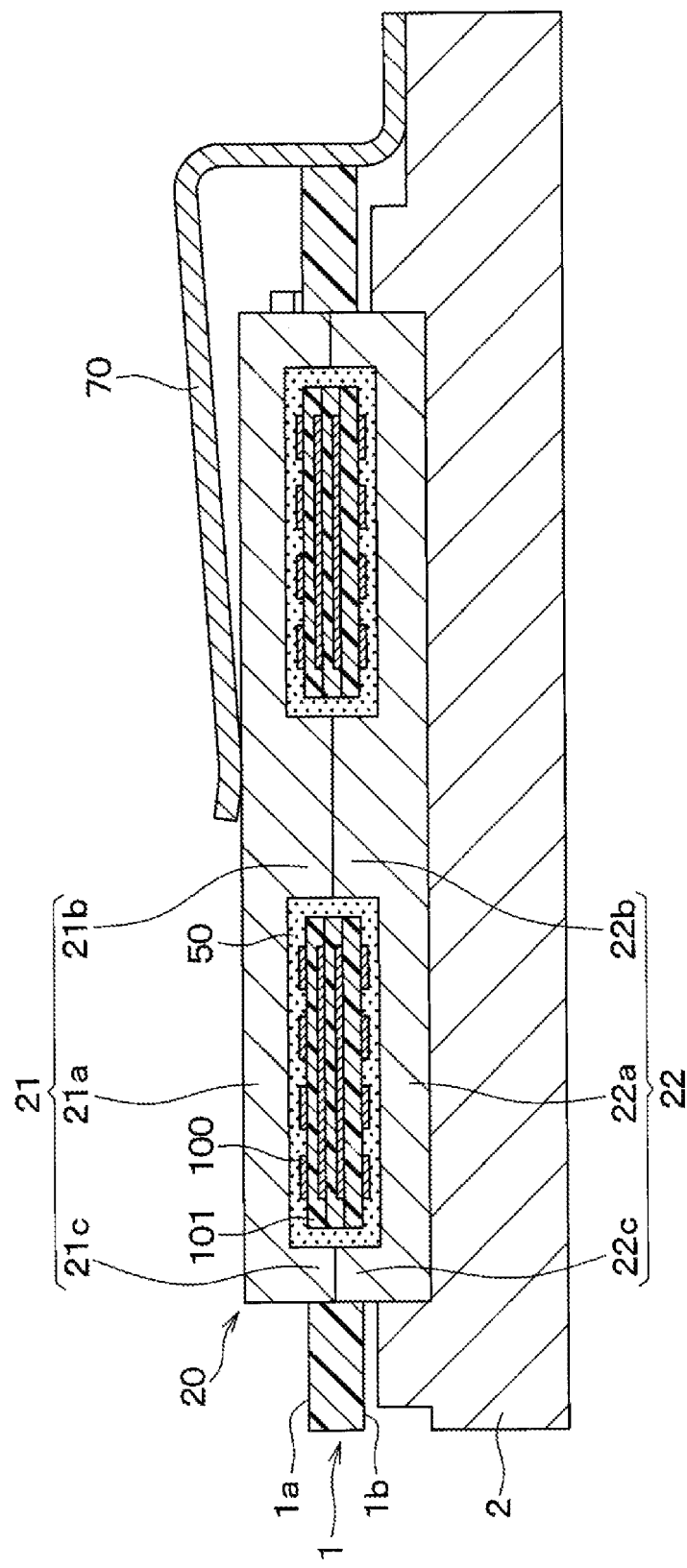

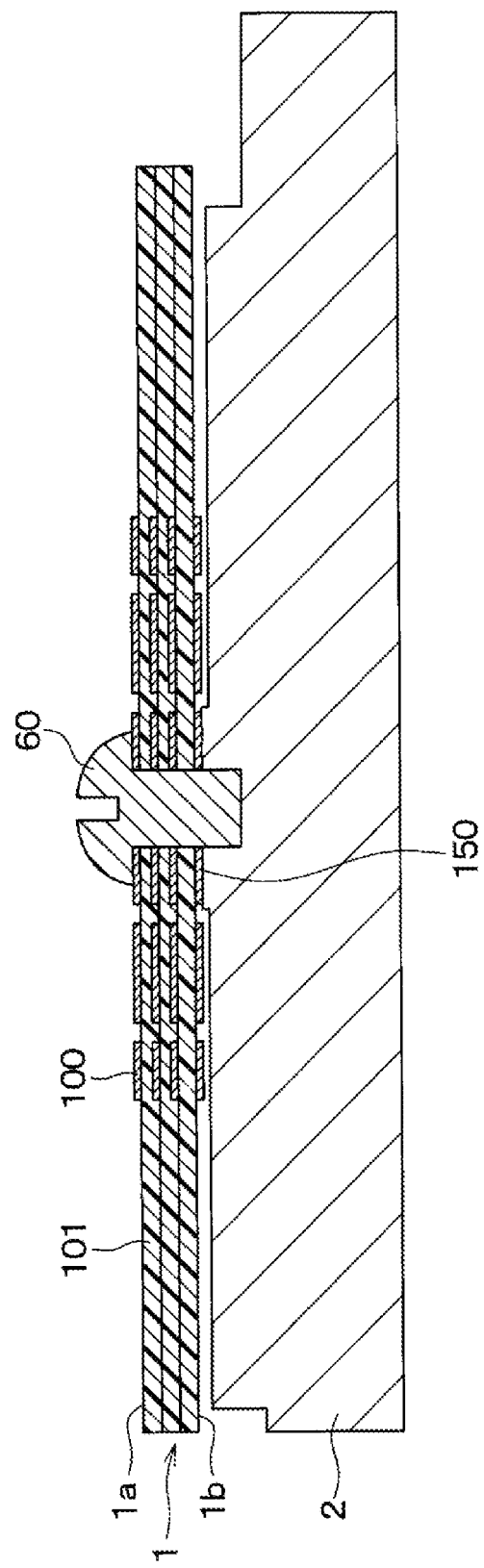

SHORT-CIRCUIT CURRENT

ELECTRONIC DEVICE

CROSS REFERENCE TO RELATED APPLICATION

This application is based on Japanese Patent Application No. 2021-042664 filed on Mar. 16, 2021 and Japanese Patent Application No. 2021-120694 filed on Jul. 21, 2021, the disclosures of which are incorporated herein by reference in their entirety.

TECHNICAL FIELD

The present disclosure relates to an electronic device having a signal wiring.

BACKGROUND ART

An electronic device such as power conversion device has a primary winding and a secondary winding as signal wiring. An insulating plate is arranged between the primary winding and the secondary winding.

SUMMARY

According to an aspect of the present disclosure, an electronic device has a substrate with one surface and the other surface opposite to the one surface. A signal wiring is formed on an insulating layer of the substrate. A heat radiating wiring formed on the insulating layer is thermally connected to the signal wiring on the same plane as the signal wiring.

BRIEF DESCRIPTION OF DRAWINGS

FIG. 5A is a cross-sectional view taken along a line VA-VA in FIG. 1.

FIG. 5B is a cross-sectional view taken along a line VB-VB in FIG. 1.

DESCRIPTION OF EMBODIMENTS

Figure 1:
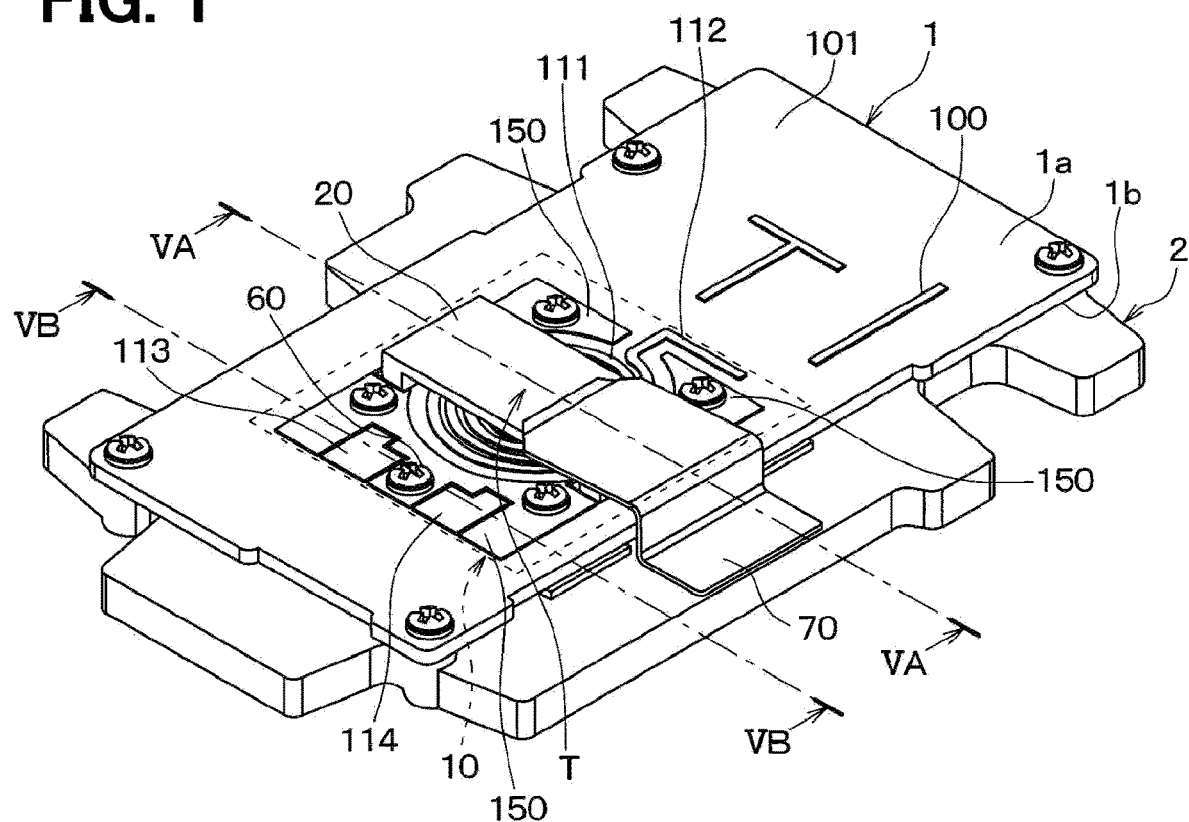
FIG. 1 is a perspective view of a power conversion device according to a first embodiment.

To begin with, examples of relevant techniques will be described.

Conventionally, an electronic device having a signal wiring is proposed. For example, as an electronic device, a power conversion device has a primary winding and a secondary winding as signal wiring. An insulating plate is arranged between the primary winding and the secondary winding. Further, in the power conversion device, a heat radiating plate is arranged on the primary winding. The power conversion device is configured by stacking the secondary winding, the insulating plate, the primary winding, and the heat radiating plate integrally formed with a molding resin.

For such an electronic device, it is desired to further improve the heat radiation property.

The present disclosure provides an electronic device capable of improving the heat radiation property.

According to an aspect of the present disclosure, an electronic device has a substrate with one surface and the other surface opposite to the one surface. A signal wiring is formed on an insulating layer of the substrate. A heat radiating wiring formed on the insulating layer is thermally connected to the signal wiring on the same plane as the signal wiring.

Accordingly, since the heat radiating wiring is arranged on the same plane as the signal wiring, it is easy to arrange the signal wiring and the heat radiating wiring in close proximity to each other. Therefore, heat can be easily dissipated from the signal wiring through the heat radiating wiring. Thus, the heat radiation property can be improved.

A reference numeral attached to each component or the like indicates an example of correspondence between the component or the like and specific component or the like described in embodiments below.

Hereinbelow, embodiments of the present disclosure will be described with reference to the drawings. In the embodiments, same or equivalent parts are designated with the same reference numerals.

First Embodiment

A first embodiment will be described with reference to the drawings. In the present embodiment, a power conversion device having a transformer T will be described as an electronic device.

As shown in FIG. 1, the power conversion device of the present embodiment includes a printed circuit board 1 and a housing 2. The printed circuit board 1 of the present embodiment is a multilayer board in which a signal wiring 100 made of copper or the like and an insulating layer 101 made of an epoxy resin or the like are alternately stacked. The printed circuit board 1 has one surface 1a and the other surface 1b.

The printed circuit board 1 has a transformer configuration region 10 which is a predetermined portion for a coil of the transformer T. The transformer configuration region 10 is provided with a core 20 to form a transformer. Although omitted in FIG. 1, electronic components such as capacitors are appropriately mounted on the printed circuit board 1 in a region different from the transformer configuration region 10.

Figure 2:
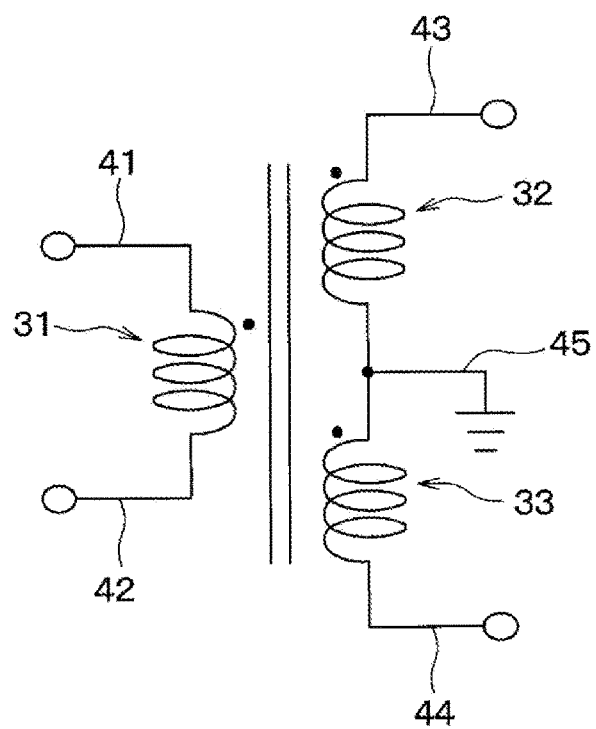
FIG. 2 is a circuit diagram of a transformer.

As shown in FIG. 2, the transformer T of the present embodiment has first to third coils 31 to 33. The first coil 31 has one end connected to the first connection wire 41 and the other end connected to the second connection wire 42. The first coil 31 is connected to an AC circuit (not shown) via the first connection wire 41 and the second connection wire 42. The second coil 32 and the third coil 33 are connected in series. The third connection wire 43 is connected to an end of the second coil 32 opposite to the third coil 33. The fourth connection wire 44 is connected to an end of the third coil 33 opposite to the second coil 32. The second coil 32 and the third coil 33 are connected to a rectifier circuit or the like (not shown) via the third connection wire 43 and the fourth connection wire 44. Further, in the present embodiment, the fifth connection wire 45 is connected between the second coil 32 and the third coil 33. The fifth connection wire 45 is connected to the housing 2 and maintained at the ground potential, as will be described later.

A signal wiring 100 is formed in the transformer configuration region 10 of the printed circuit board 1 so as to form the first to third coils 31 to 33 and the first to fifth connection wires 41 to 45. Hereinafter, the transformer configuration region 10 of the present embodiment will be specifically described.

Figure 3:
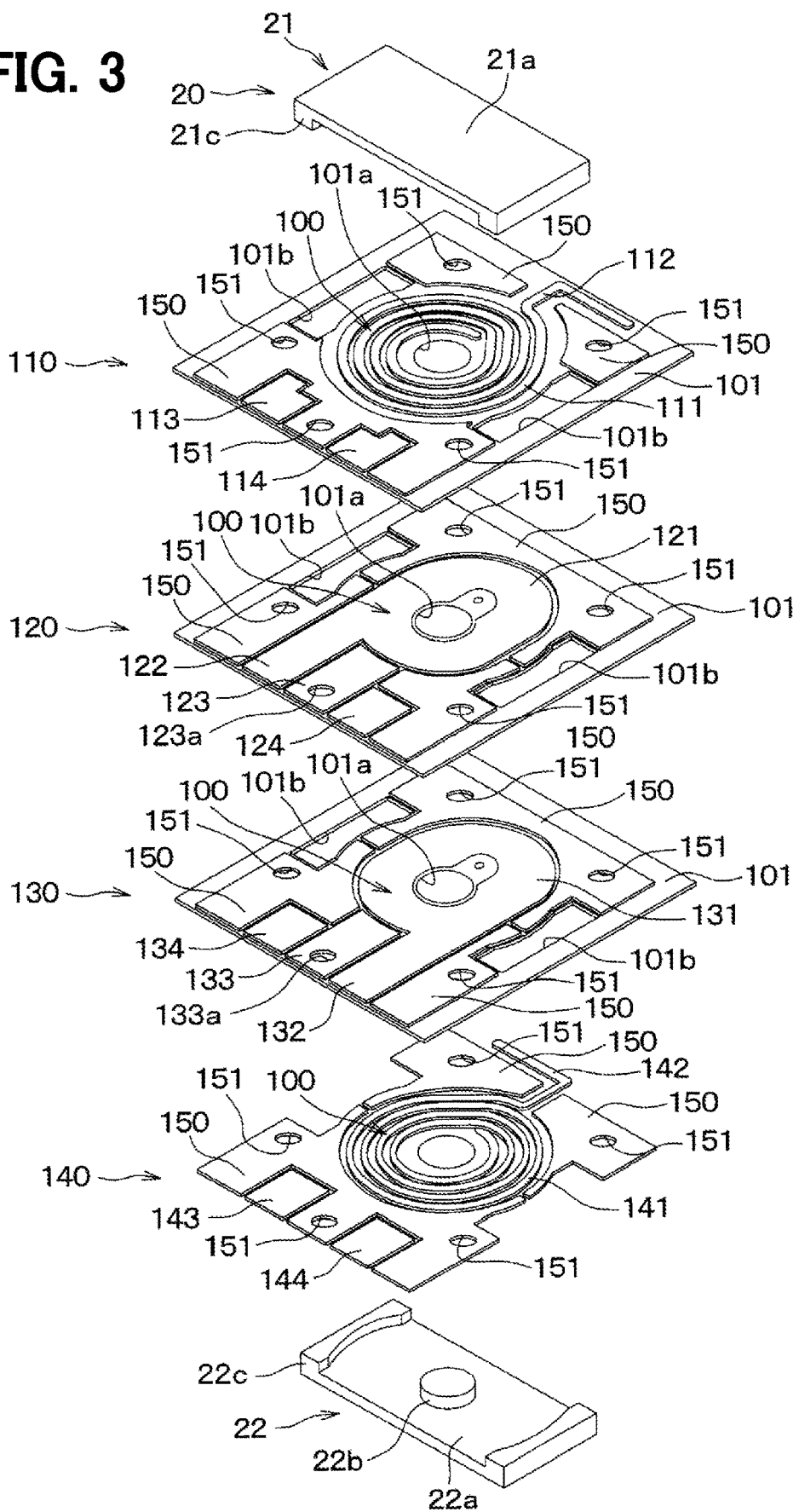
FIG. 3 is an exploded perspective view of a transformer configuration region.

As shown in FIGS. 3, 4A to 4C, 5A, and 5B, the transformer configuration region 10 of the present embodiment is configured by stacking the first to fourth constituent layers 110, 120, 130, and 140. A part of the printed circuit board 1 forms the transformer configuration region 10. Although an exploded perspective view is shown in FIG. 3, the transformer configuration region 10 is formed by integrally with the first to fourth constituent layers 110, 120, 130, and 140. The printed circuit board 1 is configured by stacking the first to fourth constituent layers 140, similarly to the transformer configuration region 10. In the following, when the description simply refers to the first to fourth constituent layer 110, 120, 130, 140, it means the first to fourth constituent layer 110, 120, 130, 140 in the transformer configuration region 10.

The first to third constituent layer 110, 120, 130 includes the signal wiring 100 and the insulating layer 101. The fourth constituent layer 140 includes the signal wiring 100. The signal wirings 100 in the first to fourth constituent layer 110, 120, 130, 140 are appropriately electrically connected via the connection via 102 formed in the first to third constituent layer 110, 120, 130. The fourth constituent layer 140 has the signal wiring 100 formed on the side opposite to the second constituent layer 120, in the insulating layer 101 of the third constituent layer 130. Therefore, it can be said that the insulating layer 101 in the third constituent layer 130 is shared by the third constituent layer 130 and the fourth constituent layer 140.

The first to third constituent layers 110, 120, and 130 have one central through hole 101a and two outer periphery through holes 101b penetrating the insulating layer 101 in the thickness direction. Specifically, the central through hole 101a is formed in the first to third constituent layers 110, 120, and 130 at a substantially central portion, and is interposed between the two outer periphery through holes 101b in the first to third constituent layers 110, 120, and 130. More specifically, the central through hole 101a and the outer periphery through hole 101b are formed at positions and sizes, such that the leg 21b, 21c, 22b, 22c of the first core 21 or the second core 22, which will be described later, can be inserted.

The first constituent layer 110 has an upper primary winding 111 arranged around the central through hole 101a on the insulating layer 101, as the signal wiring 100 forming a part of the first coil 31 in the transformer T. The upper primary winding 111 of the present embodiment has four turns, and the width is set to allow the four turns. The upper primary winding 111 is arranged between the central through hole 101a and the outer periphery through hole 101b.

The first constituent layer 110 has, as the signal wiring 100, a first lead-out wiring 112 forming the first connection wire 41. The lead-out wiring 112 is led out from the upper primary winding 111 at one end opposite to the central through hole 101a. The first constituent layer 110 has, as the signal wiring 100, a third connection wiring 113 and a fourth connection wiring 114 on a side opposite to the first lead-out wiring 112 through the central through hole 101a. The third connection wiring 113 is connected to the third lead-out wiring 122 formed in the second constituent layer 120, which will be described later, via the connection via 102. The fourth connection wiring 114 is connected to a fourth connection wiring 124 formed on the second constituent layer 120, which will be described later, via the connection via 102.

The second constituent layer 120 has a secondary winding 121 as the signal wiring 100 constituting the second coil 32 in the transformer T. The secondary winding 121 is arranged around the central through hole 101a on the insulating layer 101. The secondary winding 121 of the present embodiment has one turn, and the width corresponds to the one turn. The secondary winding 121 is arranged between the central through hole 101a and the outer periphery through hole 101b.

The second constituent layer 120 has, as the signal wiring 100, the third lead-out wiring 122 to form the third connection wire 43. The third lead-out wiring 122 is led out from one end of the secondary winding 121. The second constituent layer 120 has a fifth lead-out wiring 123 led out from the other end of the secondary winding 121 to form the fifth connection wire 45 as the signal wiring 100. The fifth lead-out wiring 123 has a fastening hole 123a through which a fastening member 60, which will be described later, is inserted. The fastening hole 123a is formed so as to penetrate the fifth lead-out wiring 123 and the insulating layer 101. Further, in the present embodiment, the third lead-out wiring 122 corresponds to a first end lead-out wiring, and the fifth lead-out wiring 123 corresponds to a second end lead-out wiring. The second constituent layer 120 has the fourth connection wiring 124 connected to a fourth lead-out wiring 132 formed in the third constituent layer 130, which will be described later, via the connection via 102.

The third lead-out wiring 122 and the fifth lead-out wiring 123 of the present embodiment are formed on the same side as the third connection wiring 113 and the fourth connection wiring 114 in the first constituent layer 110. In other words, the third lead-out wiring 122 and the fifth lead-out wiring 123 are located at a position opposite to a portion of the second constituent layer 120 facing the first lead-out wiring 112 in the first constituent layer 110 through the central through hole 101a.

The third constituent layer 130 has a tertiary winding 131 arranged around the central through hole 101a on the insulating layer 101, as the signal wiring 100 constituting the third coil 33 in the transformer T. The tertiary winding 131 of the present embodiment has one turn, and the width corresponds to the one turn. The tertiary winding 131 is arranged between the central through hole 101a and the outer periphery through hole 101b.

The third constituent layer 130 has, as the signal wiring 100, a fourth lead-out wiring 132 led out from one end of the tertiary winding 131 to form the fourth connection wire 44. The third constituent layer 130 has a fifth lead-out wiring 133 led out from the other end of the tertiary winding 131 to form the fifth connection wire 45 as the signal wiring 100. The fifth lead-out wiring 133 has a fastening hole 133a through which a fastening member 60, which will be described later, is inserted. The fastening hole 133a is formed so as to penetrate the fifth lead-out wiring 133 and the insulating layer 101. Further, in the present embodiment, the fourth lead-out wiring 132 corresponds to a first end lead-out wiring, and the fifth lead-out wiring 133 corresponds to a second end lead-out wiring. The third constituent layer 130 has a third connection wiring 134 connected to a third connection wiring 143 of the fourth constituent layer 140, which will be described later, via the connection via 102.

The fourth lead-out wiring 132 and the fifth lead-out wiring 133 of the present embodiment are formed on the same side as the third connection wiring 113 and the fourth connection wiring 114 in the first constituent layer 110. In other words, the fourth lead-out wiring 132 and the fifth lead-out wiring 133 are located opposite to a portion of the third constituent layer 120 facing the first lead-out wiring 112 in the first constituent layer 110 through the central through hole 101a.

The fourth constituent layer 140 is arranged on the side opposite to the surface of the insulating layer 101 of the third constituent layer 130 on which the tertiary winding 131 is formed. The fourth constituent layer 140 has a lower primary winding 141 as the signal wiring 100 arranged around the central through hole 101a formed in the insulating layer 101 of the third constituent layer 130. The lower primary winding 141 of the present embodiment has four turns, and the width is set to allow the four turns. The lower primary winding 141 is arranged between the central through hole 101a and the outer periphery through hole 101b formed in the third constituent layer 130. The other end of the lower primary winding 141 adjacent to the central through hole 101a is electrically connected to the other end of the upper primary winding 111 adjacent to the central through hole 101a via the connection via 102 formed in the first to third constituent layers 110, 120, 130. Therefore, the first coil 31 of the present embodiment is composed of the upper primary winding 111 and the lower primary winding 141.

The fourth constituent layer 140 has, as the signal wiring 100, a second lead-out wiring 142 led out from one end of the lower primary winding 141 opposite to the central through hole 101a to form the second connection wire 42.

The fourth constituent layer 140 has, as the signal wiring 100, the third connection wiring 143 connected to the third connection wiring 134 of the third constituent layer 130 via the connection via 102, and the fourth connection wiring 144 connected to the fourth lead-out wiring 132 via the connection via 102.

The second lead-out wiring 142 is formed on the same side as the first lead-out wiring 112 in the first constituent layer 110. Further, the third connection wiring 143 and the fourth connection wiring 144 are formed on the side opposite to the second lead-out wiring 142 through the central through hole 101a.

In the present embodiment, as described above, the first coil 31 is configured by the primary windings 111 and 141 formed in the first and fourth constituent layers 110 and 140. The second coil 32 is configured by the secondary winding 121 formed on the second constituent layer 120. The third coil 33 is formed by the tertiary winding 131 formed in the third constituent layer 130. Further, the first connection wire 41 is formed by the first lead-out wiring 112 formed in the first constituent layer 110. The second connection wire 42 is formed by the second lead-out wiring 142 formed in the fourth constituent layer 140. The third connection wire 43 is formed by the third lead-out wiring 122 formed in the second constituent layer 120. The fifth connection wire 45 is formed by the fifth lead-out wiring 123. The fourth connection wire 44 is formed by the fourth lead-out wiring 132 in the third constituent layer 130. The fifth connection wire 45 is formed by the fifth lead-out wiring 133.

Further, the first to fourth constituent layers 140 have a heat radiating wiring 150. Specifically, the first constituent layer 110 has the heat radiating wiring 150 arranged around the upper primary winding 111 on the insulating layer 101 so as to be thermally connected to the upper primary winding 111. The second constituent layer 120 has the heat radiating wiring 150 thermally connected to the secondary winding 121 around the secondary winding 121. The third constituent layer 130 has the heat radiating wiring 150 that is thermally connected to the tertiary winding 131 around the tertiary winding 131. The fourth constituent layer 140 has the heat radiating wiring 150 that is thermally connected to the lower primary winding 141 around the lower primary winding 141. That is, each of the first to fourth constituent layers 140 has the heat radiating wiring 150 on the same plane as the winding 111, 121, 131, 141. The heat radiating wiring 150 is made of, for example, copper or the like, similarly to the signal wiring 100.

Each heat radiating wiring 150 has a fastening hole 151 for inserting a fastening member 60, which will be described later. Specifically, each heat radiating wiring 150 is divided as described later, and the fastening hole 151 is formed in each of the divided regions. The fastening hole 151 is formed so as to penetrate the heat radiating wiring 150 and the insulating layer 101. Further, the fastening holes 151 in the heat radiating wirings 150 of the first to fourth constituent layers 110, 120, 130, and 140 are formed at the same positions in the normal direction with respect to the one surface 1a of the printed circuit board 1. The heat radiating wirings 150 formed in the first to fourth constituent layers 110, 120, 130, and 140 are thermally connected to each other via the connection via 102. That is, each heat radiating wiring 150 formed in the second to fourth constituent layers 120, 130, 140 is thermally connected to the heat radiating wiring 150 formed in the first constituent layer 110. In other words, each heat radiating wiring 150 formed in the first to third constituent layers 110 to 130 is thermally connected to the heat radiating wiring 150 formed in the fourth constituent layer 140.

The core 20 of the printed circuit board 1 is made of a magnetic material such as ferrite, and includes a first core 21 and a second core 22. In the present embodiment, the first core 21 has a base portion 21a, an inner leg 21b extending from the base portions 21a, and a pair of outer legs 21c extending from the base portions 21a. The second core 22 has a base portion 22a, an inner leg 22b extending from the base portions 22a, and a pair of outer legs 22c extending from the base portions 22a.

The base portion 21a, 22a has a flat plate shape with one direction as the longitudinal direction. The inner leg 21b, 22b projects in the normal direction with respect to the surface direction of the base portion 21a, 22a at the central portion in the longitudinal direction of the base portion 21a, 22a. The pair of outer legs 21c, 22c are formed so as to project in the normal direction with respect to the surface direction of the base portion 21a, 22a at both ends of the base portion 21a, 22a in the longitudinal direction. That is, each of the first core 21 and the second core 22 of the present embodiment is so-called E-type core.

The first core 21 is arranged so that the inner leg 21b is inserted into the central through hole 101a from the one surface 1a of the printed circuit board 1 and each outer leg 21c is inserted into each outer periphery through hole 101b. The second core 22 is arranged so that the inner leg 22b is inserted into the central through hole 101a from the other surface 1b of the printed circuit board 1 and each outer leg 22c is inserted into each outer periphery through hole 101b. That is, the first core 21 and the second core 22 are arranged so as to oppose each other. As a result, a closed magnetic path is formed in the transformer configuration region 10. The protrusion height of the inner legs 21b and 22b and the outer legs 21c and 22c are adjusted so that the inner legs 21b and 22b are in contact with each other and the outer legs 21c and 22c are in contact with each other when the first core 21 and the second core 22 are arranged on the printed circuit board 1.

Further, in the present embodiment, a heat radiating member 50 which is made of an insulating material having high thermal conductivity is arranged between the core 20 and the printed circuit board 1. The heat radiating member 50 is composed of a heat radiating grease, a heat radiating gap filler, a heat radiating putty sheet, a heat radiating gel sheet, or the like.

Figure 4A:
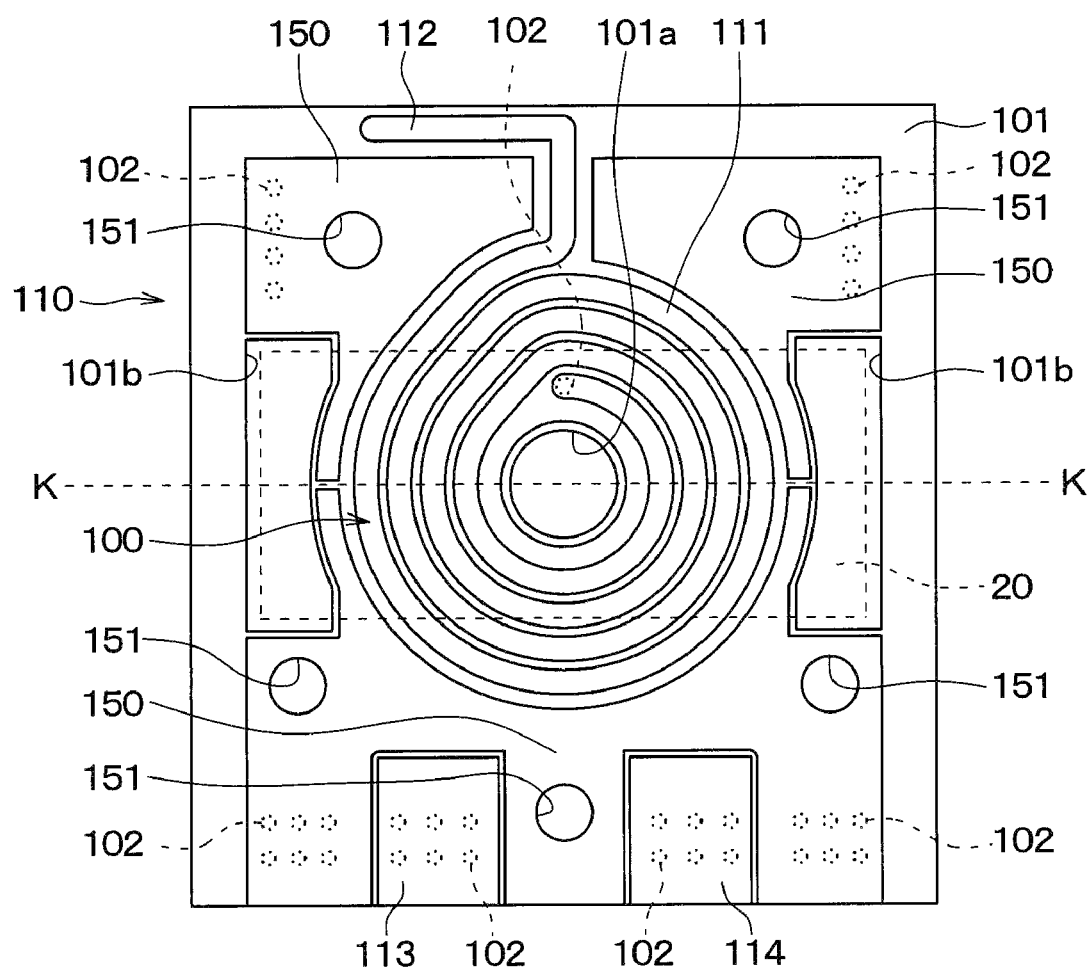
FIG. 4A is a plan view of a first constituent layer.

The heat radiating wiring 150 of the present embodiment is formed in each winding 111, 121, 131, 141, and is divided at a portion where each of the lead-out wirings 112, 122, 123, 132, 133, 142 is formed. The heat radiating wiring 150 of the present embodiment is further divided into plural regions in the normal direction with respect to the surface direction of the printed circuit board 1. Specifically, as shown in FIG. 4A, the heat radiating wiring 150 of the first constituent layer 110 is divided into a region located on one side of the core 20 and a region located on the other side of the core 20 with reference to a virtual line K passing through the upper primary winding 111 and extending along one direction in the surface direction of the printed circuit board 1. In other words, the heat radiating wiring 150 is divided around the upper primary winding 111 so as not to form a winding, and is arranged so as not to exert a function as a coil. In the present embodiment, the heat radiating wiring 150 is divided into a region located on one side of the core 20 and a region located on the other side of the core 20 in a portion overlapping the core 20.

Figure 4B:
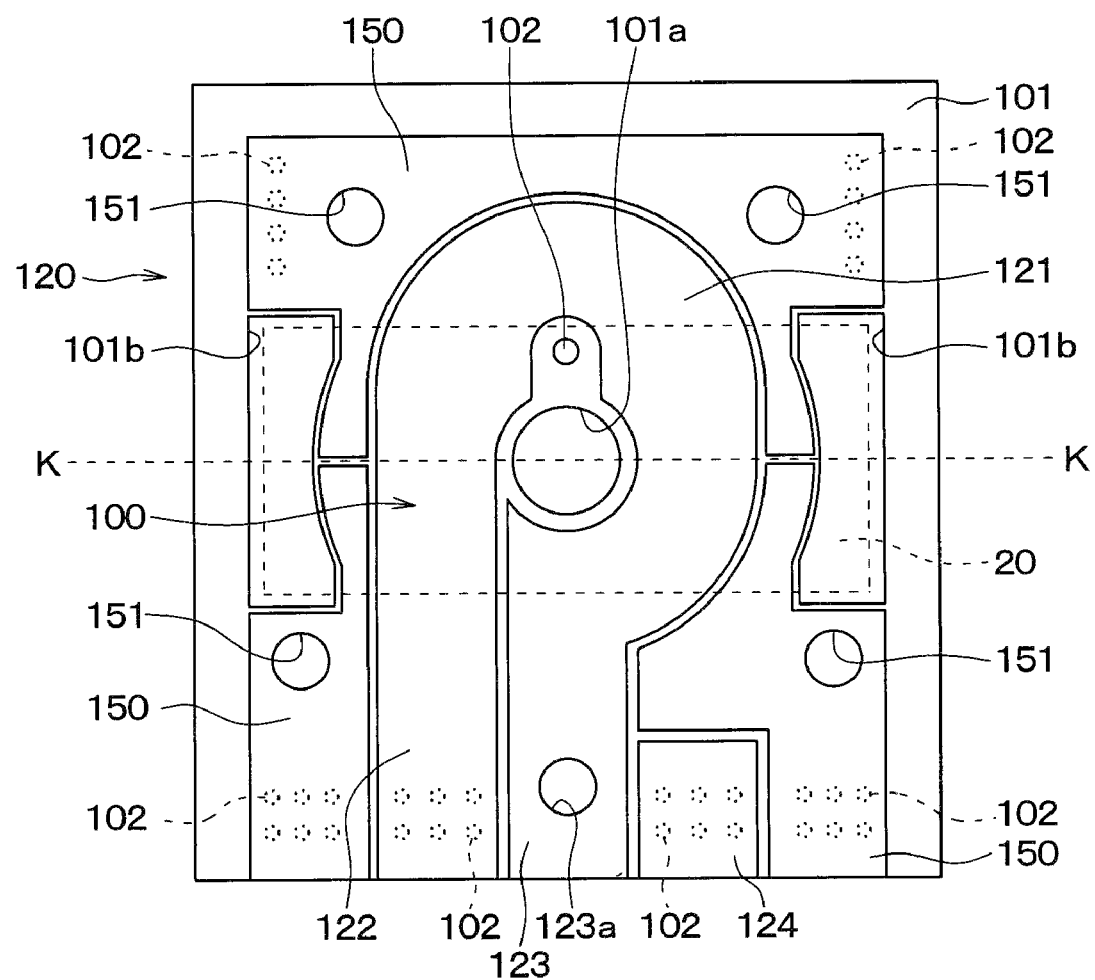
FIG. 4B is a plan view of a second constituent layer.
Figure 4C:
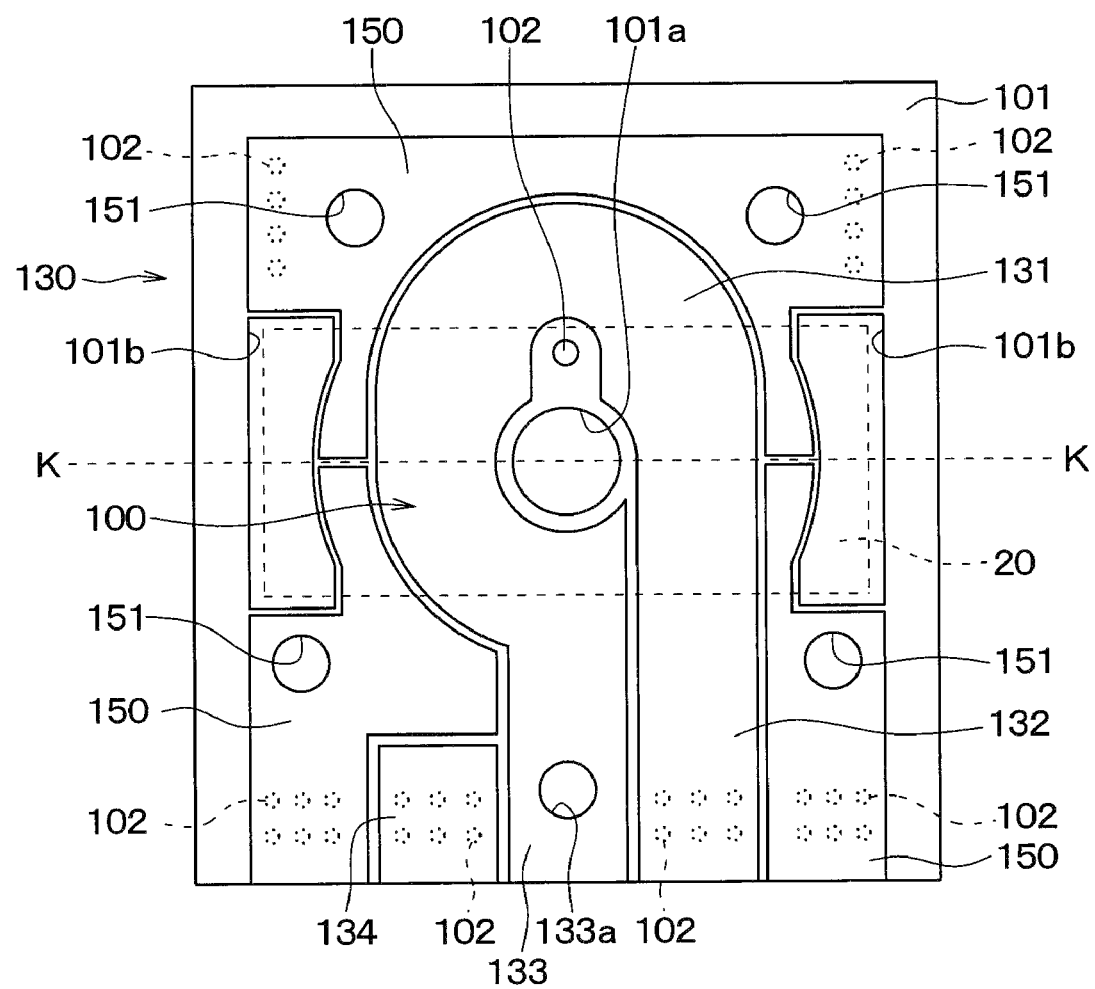
FIG. 4C is a plan view of a third constituent layer.

Similarly, the heat radiating wiring 150 of the second and third constituent layers 120 and 130 is divided in the same manner as the heat radiating wiring 150 of the first constituent layer 110. That is, as shown in FIG. 4B or FIG. 4C, the heat radiating wiring 150 of the second and third constituent layers 120 and 130 is divided into a region located on one side of the core 20 and a region located on the other side of the core 20 with respect to the virtual line K extending along one direction in the surface direction of the printed circuit board 1. Further, although the details of the heat radiating wiring 150 of the fourth constituent layer 140 are not shown, as shown in FIG. 3, the heat radiating wiring 150 is divided into a region located on one side of the core 20 and a region located on the other side of the core 20 with reference to the virtual line extending along one direction in the surface direction of the printed circuit board 1.

The housing 2 is made of a conductive material and has a predetermined shape. The printed circuit board 1 is fixed on the housing via a fastening member 60 such as a screw so that the other surface 1b faces the housing 2. The housing 2 of the present embodiment releases heat from the printed circuit board 1 and also functions as a heat radiating body.

The printed circuit board 1 is fixed on the housing 2 via the fastening member 60 at a predetermined position on the outer periphery portion. The printed circuit board 1 is fixed on the housing 2 via the fastening member 60 passing through a fastening hole 123a formed in the fifth lead-out wiring 123 of the second constituent layer 120 and a fastening hole 133a formed in the fifth lead-out wiring 133 of the third constituent layer 130 in the transformer configuration region 10. As a result, the fifth lead-out wiring 123, 133 is thermally and electrically connected to the housing 2. Further, the printed circuit board 1 is fixed to the housing 2 in the transformer configuration region 10 via a fastening member 60 inserted in the fastening hole 151 formed in the heat radiating wiring 150. As a result, the heat radiating wiring 150 formed in the first constituent layer 110 is thermally connected to the housing 2 via the fastening member 60. Further, since the heat radiating wiring 150 formed in the second to fourth constituent layer 120, 130, 140 is thermally connected to the heat radiating wiring 150 formed in the first constituent layer 110, the printed circuit board 1 is thermally connected to the housing 2 via the heat radiating wiring 150 formed in the first constituent layer 110 and the fastening member 60. That is, all the heat radiating wirings 150 formed in the first to fourth constituent layers 110, 120, 130, 140 are thermally connected to the housing 2 via the fastening member 60. Further, as shown in FIG. 5B, the fourth constituent layer 140 is arranged so that the heat radiating wiring 150 of the fourth constituent layer 140 is in direct contact with the housing 2. The heat radiating wiring 150 formed in the first to third constituent layers 110, 120, and 130 is thermally connected to the heat radiating wiring 150 formed in the fourth constituent layer 140. Therefore, the heat radiating wiring 150 formed in the first to third constituent layers 110, 120, 130 is thermally connected to the housing 2 via the heat radiating wiring 150 formed in the fourth constituent layer 140.

As described above, the heat radiating wiring 150 is divided into plural regions. Further, the heat radiating wiring 150 is also divided according to the shape of the signal wiring 100 in each of the constituent layers 110, 120, 130, 140. However, the heat radiating wirings 150 in each of the constituent layers 110, 120, 130, 140 are appropriately connected through the connection via 102. The location of the fastening member 60 and the connection via 102 which connects the heat radiating wirings 150 between the constituent layers 110, 120, 130, 140 are adjusted such that all the heat radiating wirings 150 are thermally connected to the housing 2.

The housing 2 of the present embodiment has a holder 70 made of metal. One end of the holder 70 is located on the printed circuit board 1, and the other end is fixed. Then, the core 20 is arranged on the printed circuit board 1 so as to be pressed by the one end of the holder 70.

According to the present embodiment, the heat radiating wiring 150 is arranged on the printed circuit board 1 on the same plane as the windings 111, 121, 131, 141. Therefore, the heat radiating wiring 150 can be easily arranged in the vicinity of the windings 111, 121, 131, 141, such that the heat radiating property can be improved.

(1) In the present embodiment, the transformer T is configured by using the printed circuit board 1 as a multilayer board. Therefore, the size can be reduced as compared with a case where members corresponding to the signal wiring 100, the insulating layer 101, the heat radiating wiring 150, and the like in the present embodiment are separately prepared and stacked.

(2) In the present embodiment, the heat radiating member 50 is arranged between the printed circuit board 1 and the core 20. Therefore, the heat of the printed circuit board 1 can be released from the core 20 via the heat radiating member 50. In this embodiment, the core 20 is pressed against the holder 70. Therefore, heat can be dissipated from the printed circuit board 1 to the housing 2 via the core 20 and the holder 70.

Figure 6:
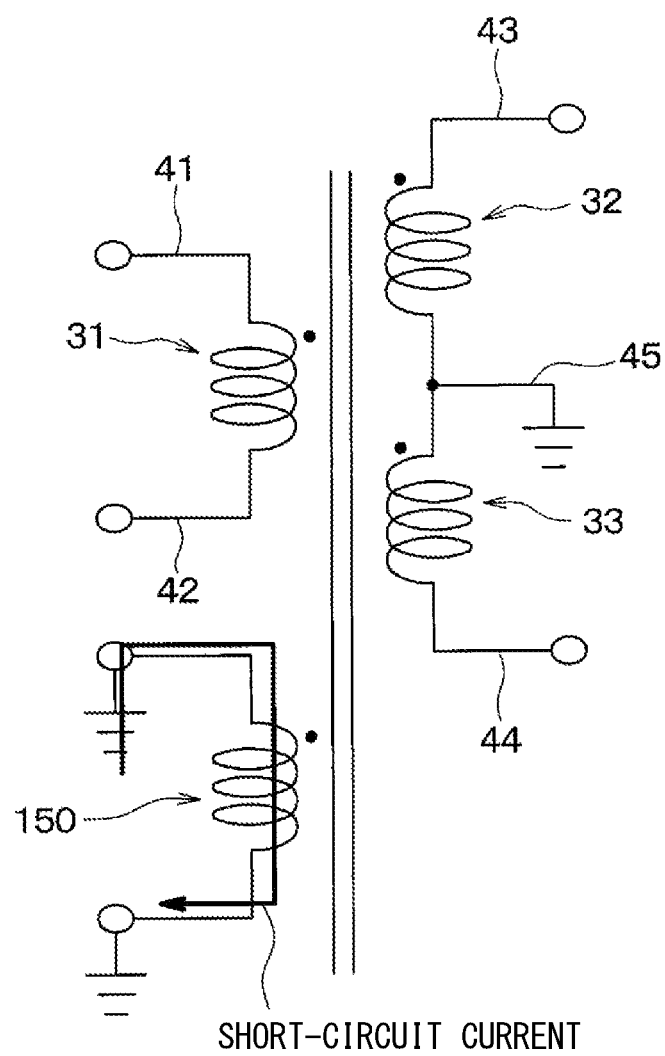
FIG. 6 is a diagram for explaining an issue that may occur when a heat radiating wiring is not divided.

(3) In the present embodiment, the heat radiating wiring 150 is divided into a region located on one side of the core 20 and a region located on the other side of the core 20 with reference to the virtual line K extending along one direction in the surface direction of the printed circuit board 1. That is, the heat radiating wiring 150 is arranged so as not to function as a coil. Therefore, the loss of the transformer T can be reduced as compared with a case where the heat radiating wiring 150 is not divided in this way. That is, when the heat radiating wiring 150 is not divided, the heat radiating wiring 150 may function as a coil by forming the heat radiating wiring 150 around the windings 111, 121, 131, 141. In this case, as shown in FIG. 6, the heat radiating wiring 150 functions as a coil, so that a short-circuit current flows through the heat radiating wiring 150, causing a loss in the transformer T. In contrast, the heat radiating wiring 150 of this embodiment is arranged so as not to function as a coil. Therefore, it is possible to suppress the occurrence of loss in the transformer T due to the short-circuit current flowing through the heat radiating wiring 150.

Modification of First Embodiment

Figure 7:
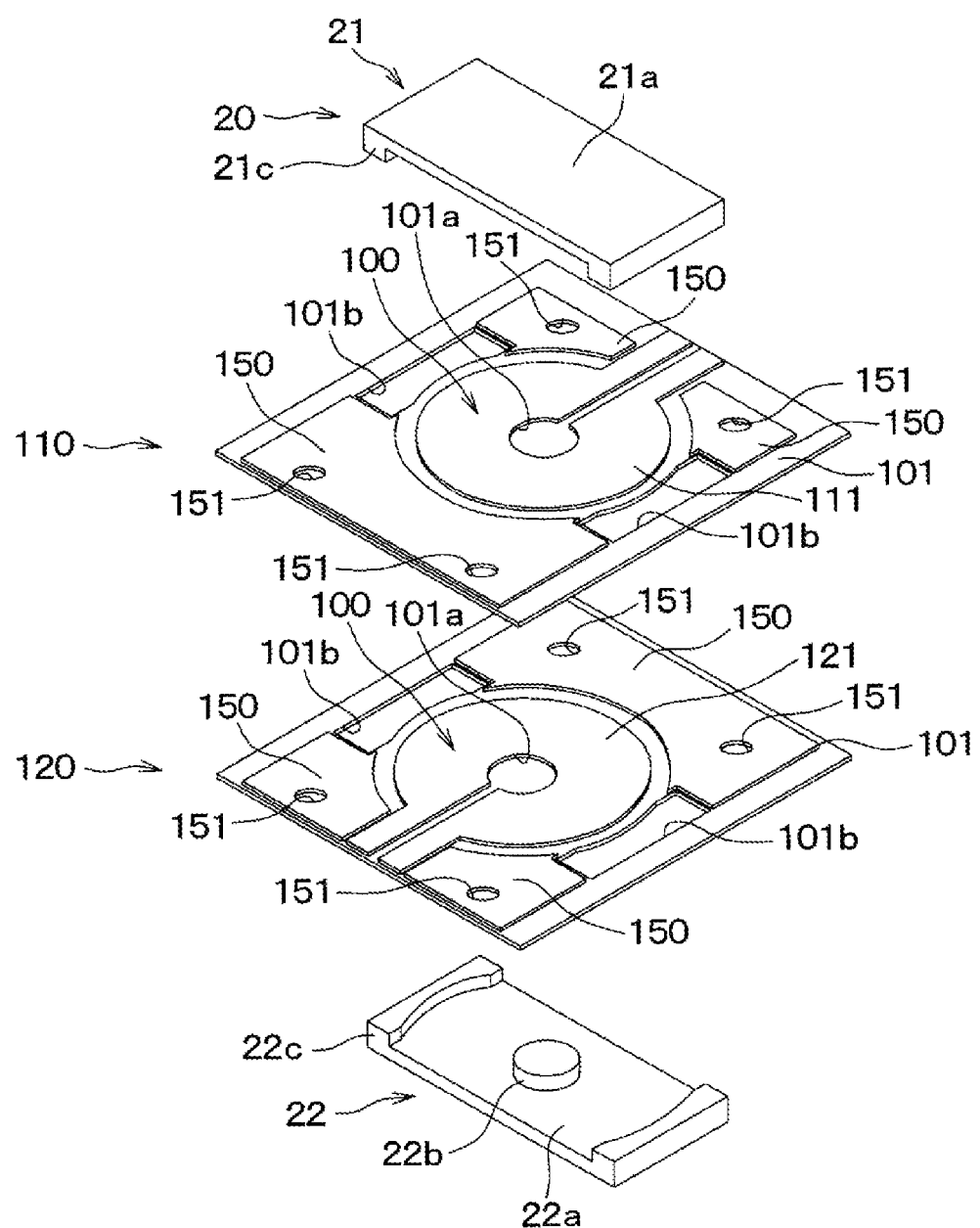
FIG. 7 is an exploded perspective view of a transformer configuration region in a modification of the first embodiment.

A modification of the first embodiment will be described. In the first embodiment, the configuration of the transformer configuration region 10 can be changed as appropriate. For example, as shown in FIG. 7, in the transformer configuration region 10, the first constituent layer 110 in which the primary winding 111 is formed and the second constituent layer 120 in which the secondary winding 121 is formed are stacked with each other. Note that FIG. 7 shows an example in which each of the primary winding 111 and the secondary winding 121 has one turn. Further, although not particularly shown, the second coil 32 may be configured by connecting windings formed in different constituent layers, similarly to the first coil 31. Similarly, the third coil 33 may be configured by connecting windings formed in different constituent layers, similarly to the first coil 31.

Second Embodiment

A second embodiment will be described below. This embodiment is a modification of the first embodiment in which the configurations of the second constituent layer 120 and the third constituent layer 130 are changed. Descriptions of the same configurations and processes as those of the first embodiment will not be repeated hereinafter.

Figure 8A:
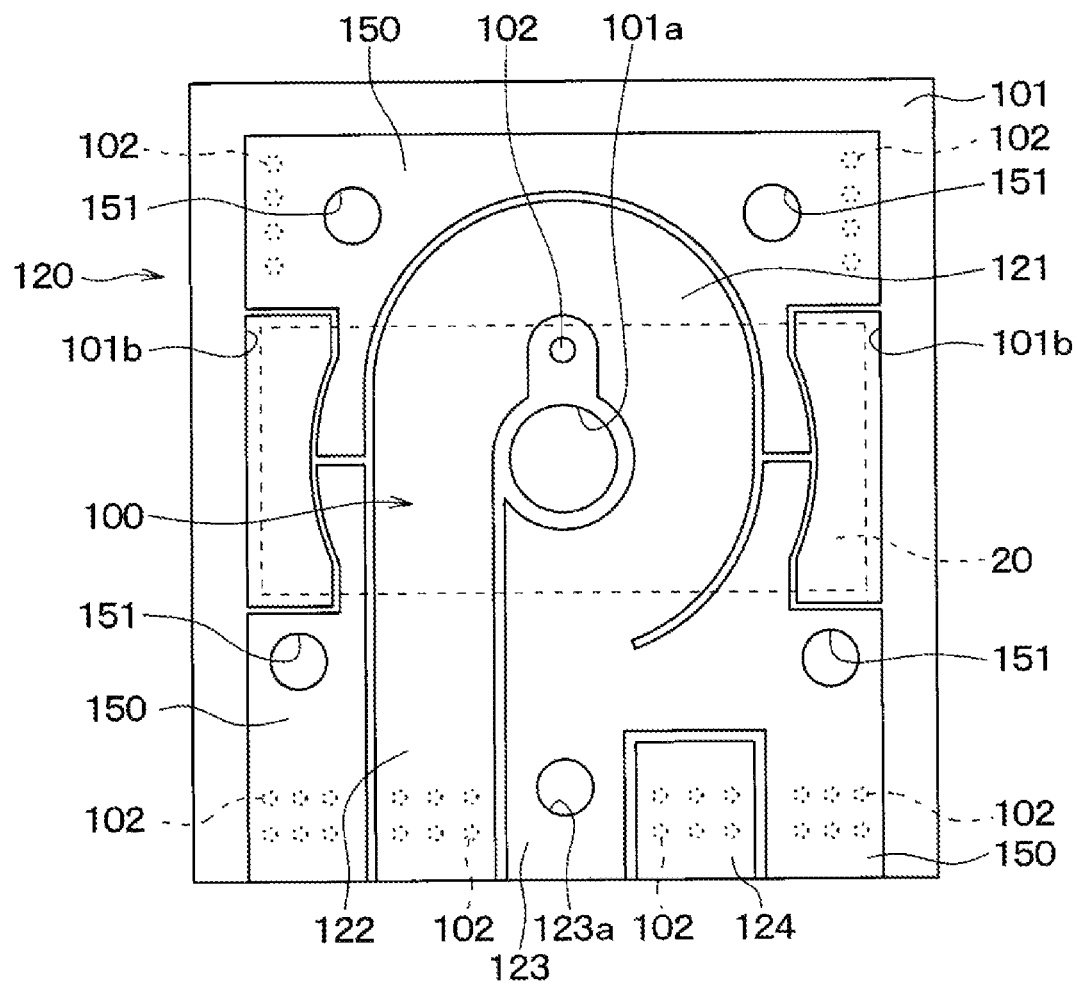
FIG. 8A is a plan view of a second constituent layer in a second embodiment.
Figure 8B:
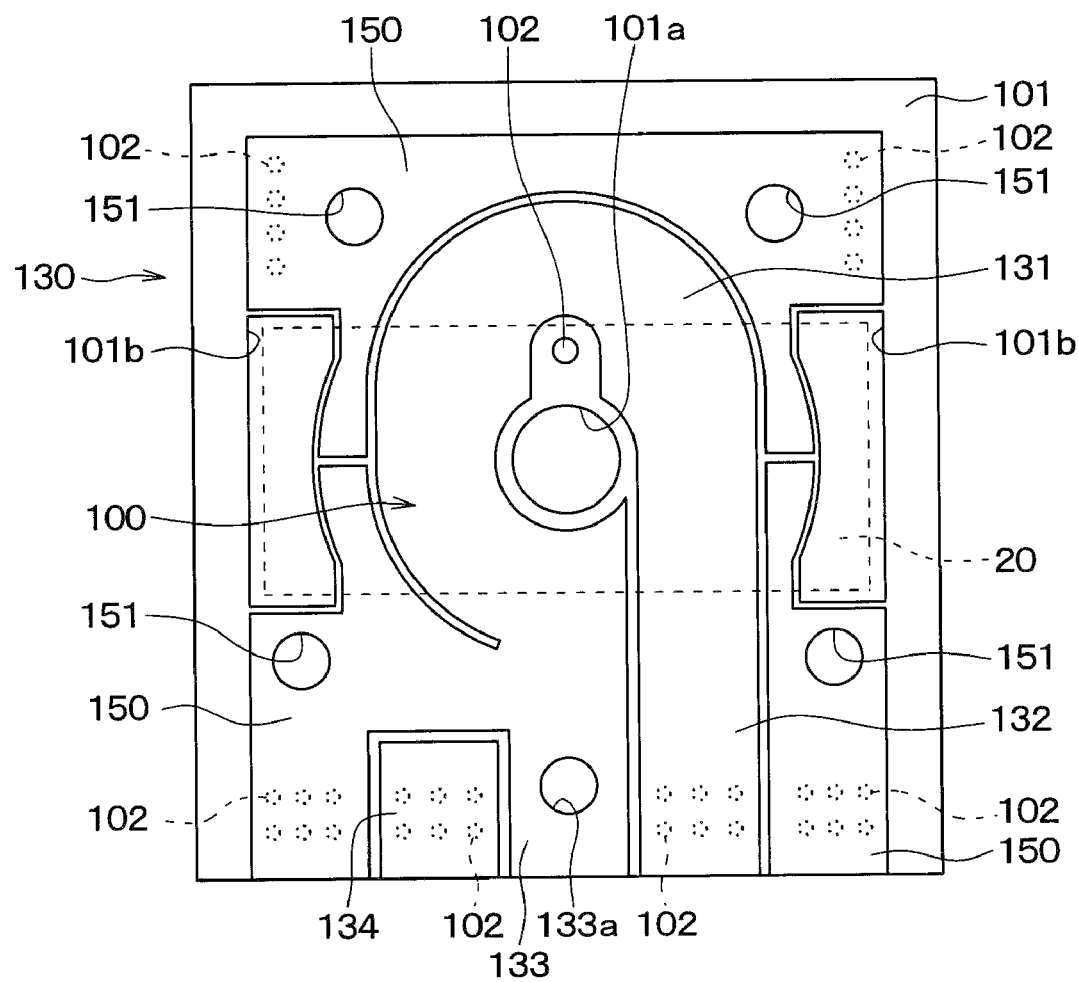
FIG. 8B is a plan view of a third constituent layer in the second embodiment.

In the power conversion device of the present embodiment, as shown in FIG. 8A, in the second constituent layer 120, the fifth lead-out wiring 123 and the heat radiating wiring 150 are connected with each other. Further, as shown in FIG. 8B, in the third constituent layer 130, the fifth lead-out wiring 133 and the heat radiating wiring 150 are connected with each other. That is, a part of the heat radiating wiring 150 of the present embodiment functions as the signal wiring 100.

According to the present embodiment, since the heat radiating wiring 150 is arranged on the same plane as the windings 111, 121, 131, 141, the same effect as that of the first embodiment can be obtained.

(1) In the present embodiment, the fifth lead-out wiring 123 and the heat radiating wiring 150 are connected in the second constituent layer 120. In the third constituent layer 130, the fifth lead-out wiring 133 and the heat radiating wiring 150 are connected. Therefore, as compared with the first embodiment, the area of the fifth lead-out wiring 123, 133 in the second and third constituent layers 120, 130 increases. Therefore, the wiring resistance of the fifth lead-out wiring 123, 133 can be reduced to suppress heat generation in the fifth lead-out wiring 123, 133.

Modification of Second Embodiment

A modification of the second embodiment will be described below. In the second embodiment, only one of the fifth lead-out wiring 123 of the second constituent layer 120 and the fifth lead-out wiring 133 of the third constituent layer 130 may be connected to the heat radiating wiring 150.

Third Embodiment

A third embodiment will be described below. In this embodiment, the configurations of the second constituent layer 120 and the third constituent layer 130 are changed from those of the second embodiment. Descriptions will not be repeated hereinafter since the other configurations and processes are the same as those of the second embodiment.

Figure 9A:
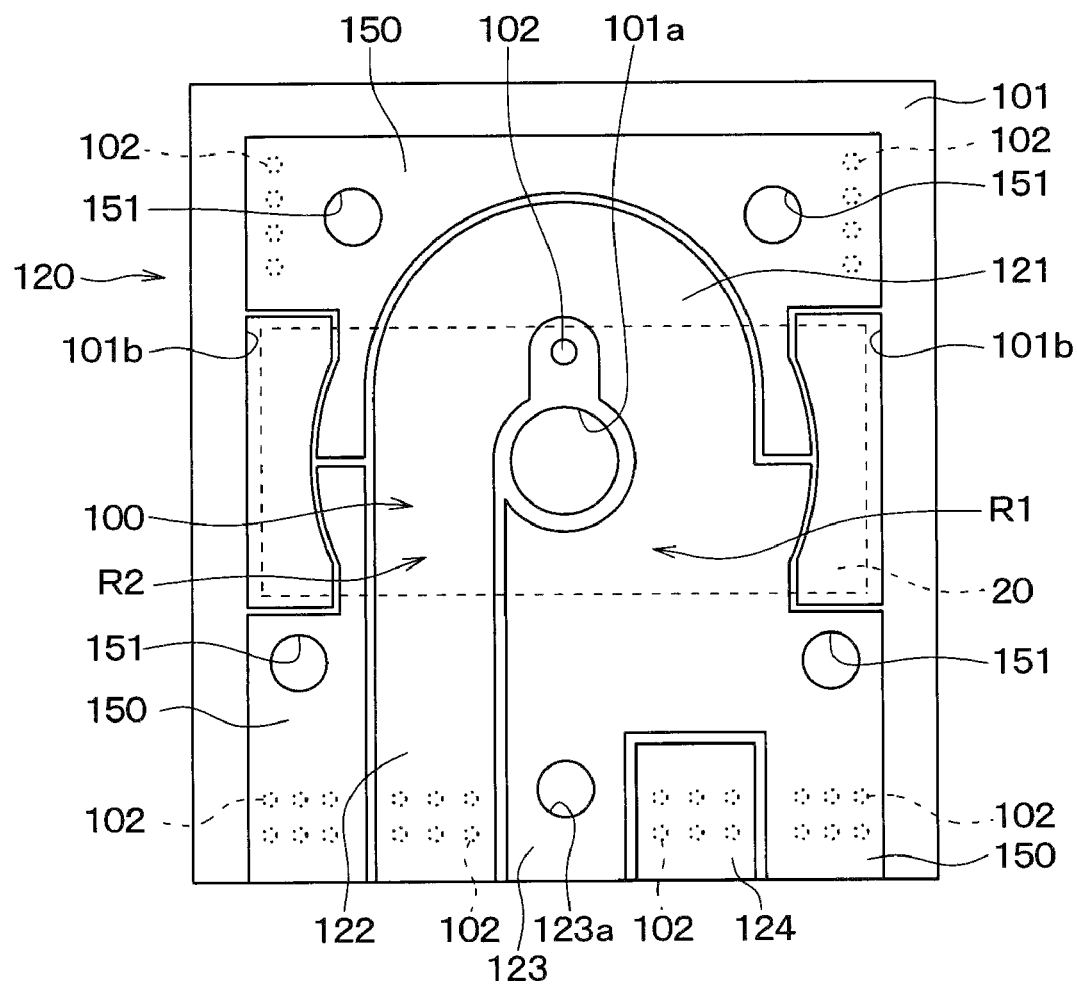
FIG. 9A is a plan view of a second constituent layer in a third embodiment.
Figure 9B:
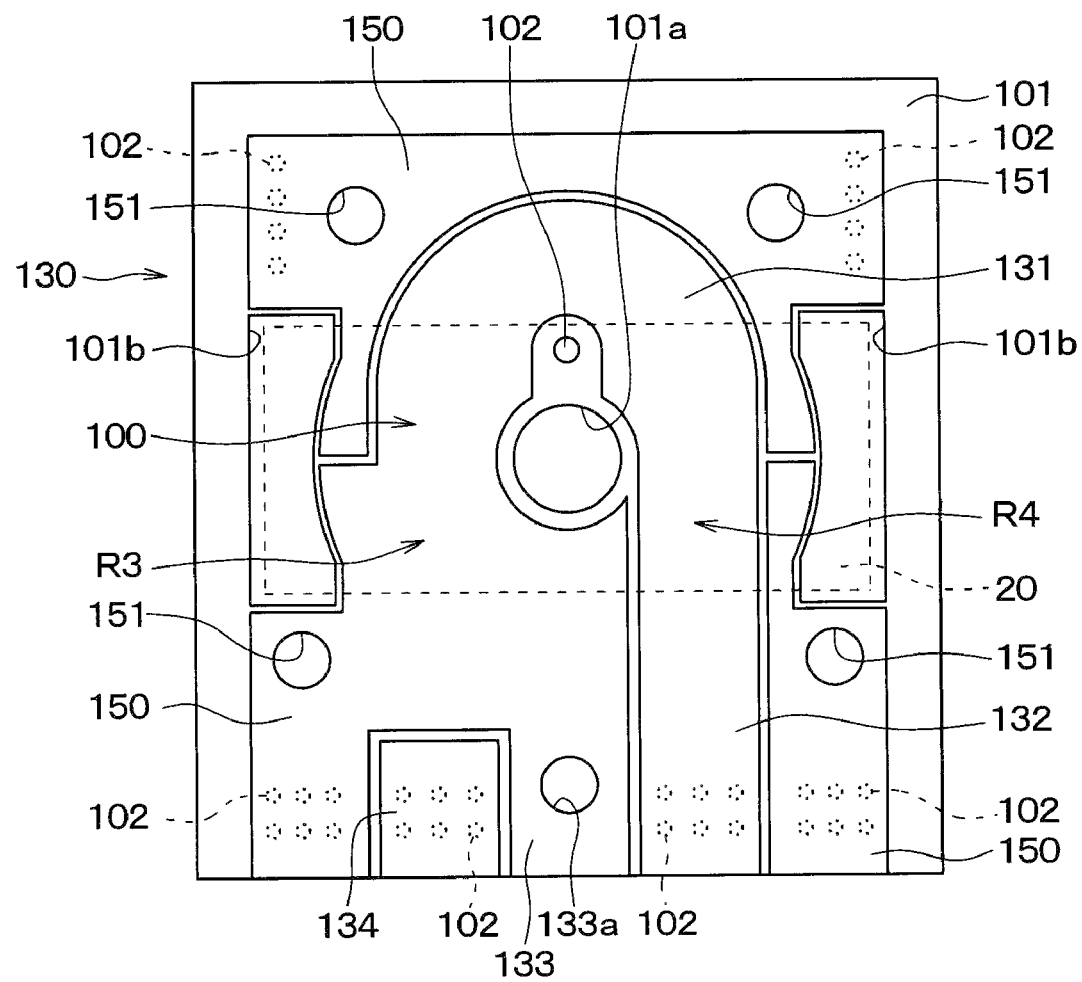
FIG. 9B is a plan view of a third constituent layer in the third embodiment.

In the power conversion device of the present embodiment, as shown in FIG. 9A, in the second constituent layer 120, the connection region R1 connecting the secondary winding 121 and the fifth lead-out wiring 123 is larger than the connection region R2 connecting the secondary winding 121 and the third lead-out wiring 122. Further, as shown in FIG. 9B, in the third constituent layer 130, the connection region R3 connecting the tertiary winding 131 and the fifth lead-out wiring 133 is made larger than the connection region R4 connecting the tertiary winding 131 and the fourth lead-out wiring 132.

According to the present embodiment, since the heat radiating wiring 150 is arranged on the same plane as the windings 111, 121, 131, 141, the same effect as that of the first embodiment can be obtained.

(1) In the present embodiment, the connection region R1 between the secondary winding 121 and the fifth lead-out wiring 123 is made larger than the connection region R2 between the secondary winding 121 and the third lead-out wiring 122. Therefore, as compared with a case where the connection region R1 between the secondary winding 121 and the fifth lead-out wiring 123 is equal to the connection region R2 between the secondary winding 121 and the third lead-out wiring 122, the wiring resistance of the fifth lead-out wiring 123 can be further reduced to suppress heat generation in the fifth lead-out wiring 123.

Similarly, the connection region R3 between the tertiary winding 131 and the fifth lead-out wiring 133 is made larger than the connection region R4 between the tertiary winding 131 and the fourth lead-out wiring 132. Therefore, as compared with a case where the connection region R3 between the tertiary winding 131 and the fifth lead-out wiring 133 is equal to the connection region R4 between the tertiary winding 131 and the fourth lead-out wiring 132, the wiring resistance of the fifth lead-out wiring 133 can be further reduced to suppress heat generation in the fifth lead-out wiring 133.

Modification of Third Embodiment

A modification of the third embodiment will be described. In the third embodiment, the size of the connection region may be different only in one of the second constituent layer 120 and the third constituent layer 130.

Fourth Embodiment

A fourth embodiment will be described. In this embodiment, a one-side heat radiating member and the other-side heat radiating member are arranged, compared with the first embodiment. Descriptions will not be repeated hereinafter since the other configurations and processes are the same as those of the first embodiment.

Figure 10:
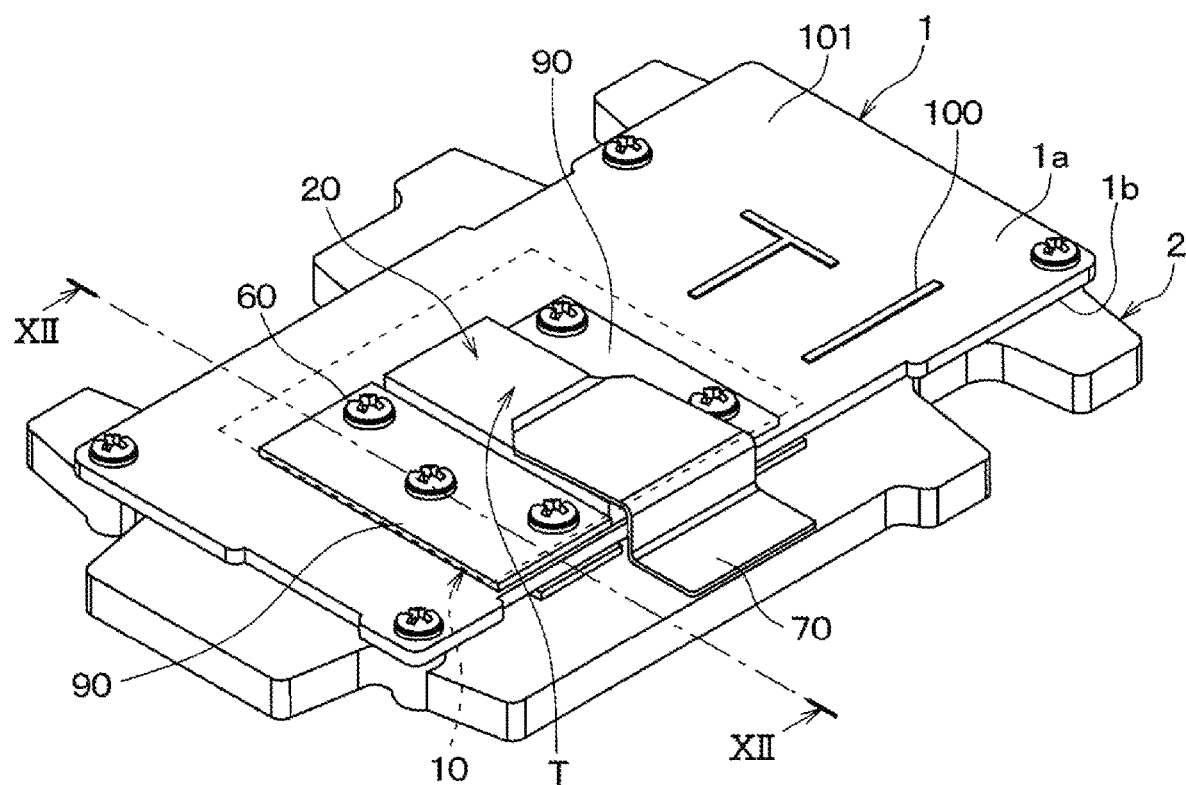
FIG. 10 is a perspective view of a power conversion device according to a fourth embodiment.
Figure 11:
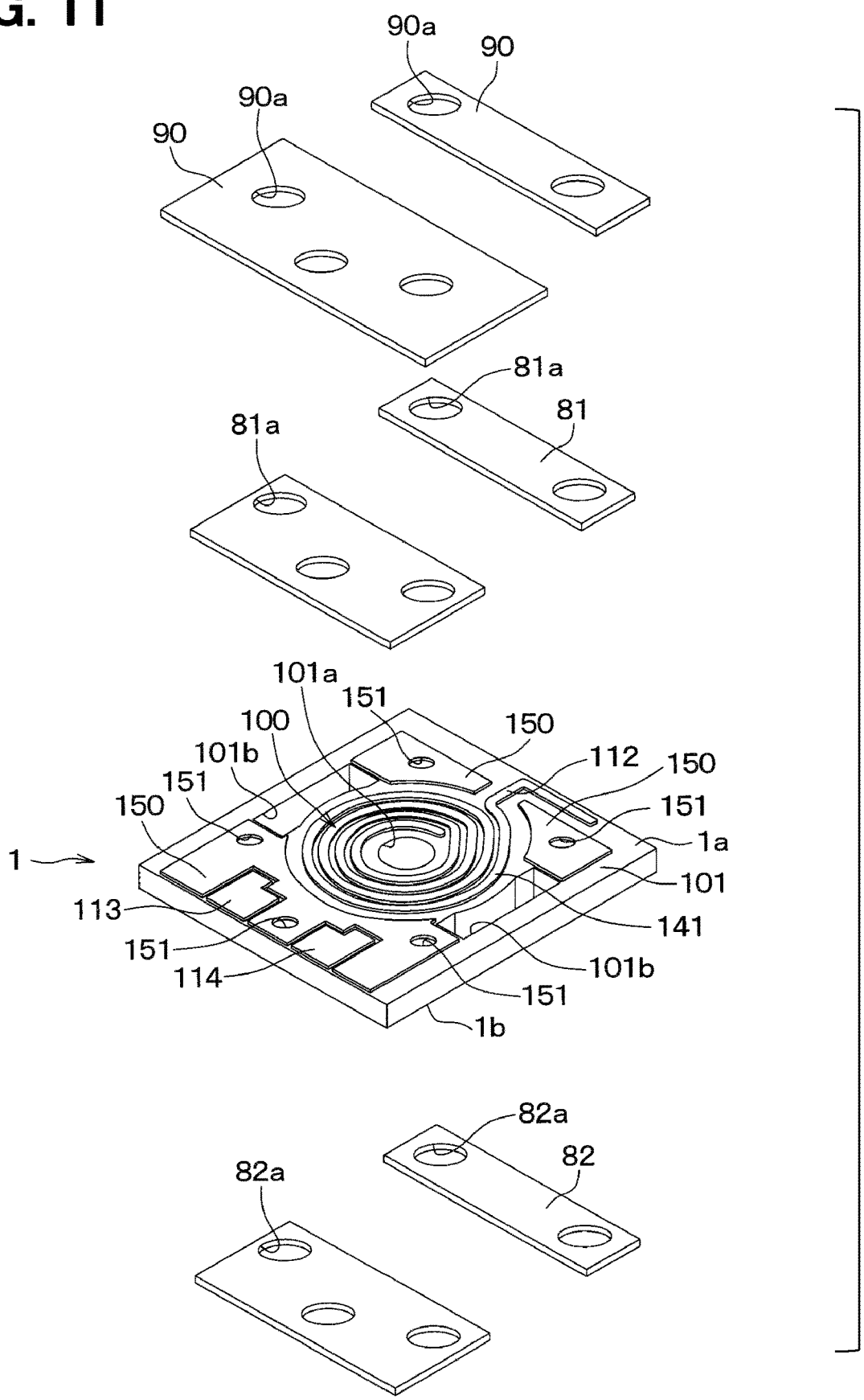
FIG. 11 is an exploded perspective view of a pressing member, a one-side heat radiating member, a transformer configuration region, and the other-side heat radiating member.
Figure 12:
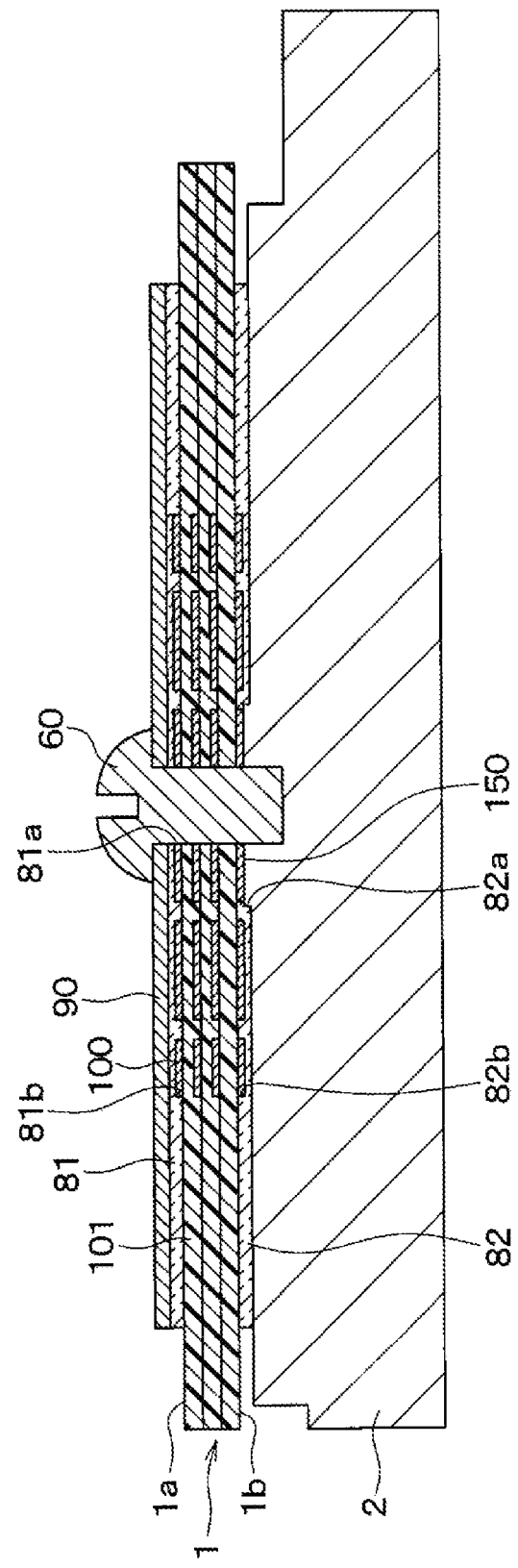
FIG. 12 is a cross-sectional view taken along a line XII-XII in FIG. 10.

In the power conversion device of the present embodiment, as shown in FIGS. 10 to 12, in the transformer configuration region 10 of the printed circuit board 1, the one-side heat radiating member 81 is arranged on the one surface 1a and the other-side heat radiating member 82 is arranged on the other surface 1b.

The one-side heat radiating member 81 and the other-side heat radiating member 82 have a predetermined thickness and thermal conductivity, and are made of a heat radiating grease, a heat radiating gap filler, a heat radiating putty sheet, a heat radiating gel sheet, or the like made of an insulating material. Note that FIG. 11 shows a sheet-like member as the one-side heat radiating member 81 and the other-side heat radiating member 82. The one-side heat radiating member 81 and the other-side heat radiating member 82 have insertion holes 81a and 82a, respectively, through which the fastening member 60 is inserted. Further, the one-side heat radiating member 81 has a recessed portion 81b corresponding to the signal wiring 100 in the first constituent layer 110. The other-side heat radiating member 82 has a recessed portion 82b corresponding to the signal wiring 100 in the fourth constituent layer 140. In FIG. 11, the recessed portion 82b formed in the other-side heat radiating member 82 is omitted.

A pressing member 90 is arranged on the one surface 1a of the printed circuit board 1 via the one-side heat radiating member 81. In the present embodiment, the two pressing members 90 are arranged to press the one-side heat radiating member 81 exposed from the core 20 in the normal direction with respect to the surface direction of the printed circuit board 1, on both sides through the core 20. Further, the pressing member 90 has an insertion hole 90a into which the fastening member 60 is inserted. The pressing member 90 of the present embodiment is made of copper or the like.

Then, the printed circuit board 1 is arranged in the housing 2 so that the other-side heat radiating member 82 is located between the other surface 1b and the housing 2 and the other-side heat radiating member 82 side abuts on the housing 2. Further, the printed circuit board 1 is fixed on the housing 2 via the fastening member 60 in a state where the one-side heat radiating member 81 and the pressing member 90 are arranged on the one surface 1a, and the fastening member 60 is thermally connected to the pressing member 90.

According to the present embodiment, since the heat radiating wiring 150 is arranged on the same plane as the windings 111, 121, 131, 141, the same effect as that of the first embodiment can be obtained.

(1) In the present embodiment, the other-side heat radiating member 82 is arranged between the housing 2 and the printed circuit board 1. Therefore, heat can be radiated from the windings 111, 121, 131, 141 of the first to third coils 31 to 33 to the housing 2 via the other-side heat radiating member 82. Thus, the heat radiating property can be further improved.

(2) In the present embodiment, the one-side heat radiating member 81 is arranged on the one surface 1a of the printed circuit board 1. Therefore, the heat of the windings 111, 121, 131, 141 of the first to third coils 31 to 33 is also transmitted to the pressing member 90 via the one-side heat radiating member 81. Since the pressing member 90 is thermally connected to the fastening member 60, the heat radiating to the housing 2 can be further improved.

Fifth Embodiment

A fifth embodiment will be described. In this embodiment, the pressing member 90 and the holder 70 are integrated with respect to the fourth embodiment. Descriptions of the same configurations and processes as those of the fourth embodiment will not be repeated hereinafter.

Figure 13:
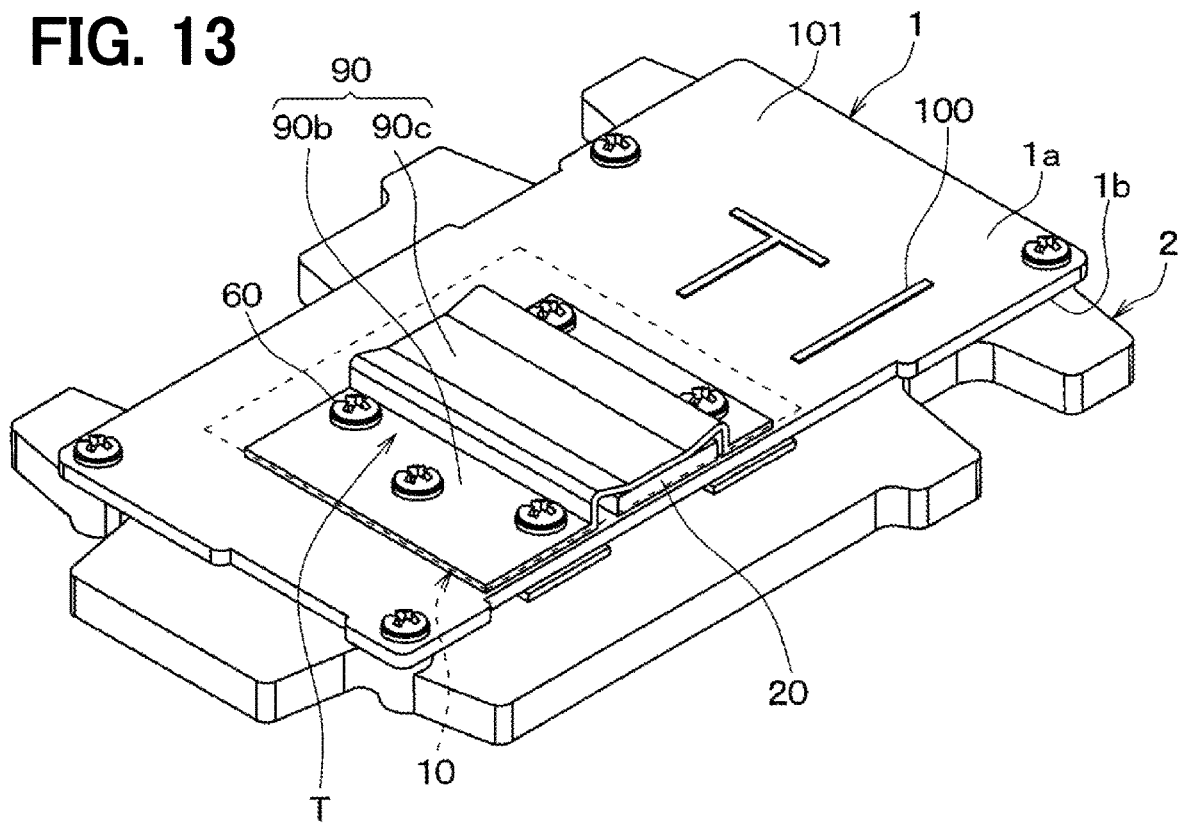
FIG. 13 is a perspective view of a power conversion device according to a fifth embodiment.

In the power conversion device of the present embodiment, as shown in FIG. 13, the pressing member 90 has two supporting portions 90b located on the one surface 1a of the printed circuit board 1 and fastened by the fastening member 60, and one pressing portion 90c located on the core 20. The shape of the pressing portion 90c is adjusted so that the core 20 can be pressed. The pressing member 90 of the present embodiment is configured such that two supporting portions 90b are connected with each other by the one pressing portion 90c. That is, the pressing member 90 of the present embodiment is composed of one member. Further, the power conversion device of the present embodiment does not include the holder 70 described in the first embodiment.

According to the present embodiment, since the heat radiating wiring 150 is arranged on the same plane as the windings 111, 121, 131, 141, the same effect as that of the first embodiment can be obtained.

(1) According to the present embodiment, since the core 20 is pressed by the pressing member 90, it is not necessary to provide the holder 70. Therefore, as compared with the fourth embodiment, the number of parts can be reduced. Further, since the core 20 is pressed by the pressing member 90, the heat of the core 20 can be dissipated to the housing 2 via the pressing member 90 and the fastening member 60.

Modification of Fifth Embodiment

Figure 14:
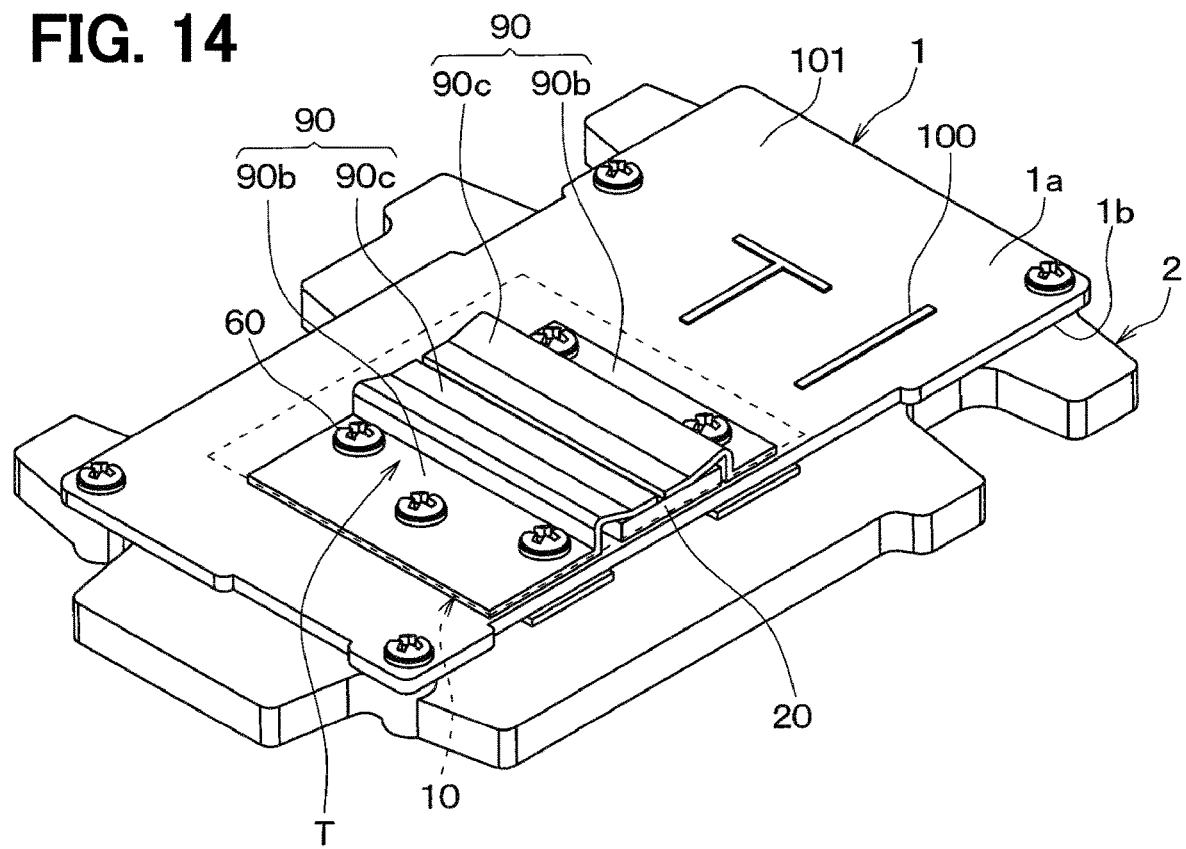
FIG. 14 is a perspective view of a power conversion device according to a modification of the fifth embodiment.

A modification of the fifth embodiment will be described below. In the fifth embodiment, as shown in FIG. 14, the pressing member 90 may have the pressing portion 90c on each of the two supporting portions 90b. That is, as compared with the fifth embodiment, in the pressing member 90, the pressing portion 90c provided on one supporting portion 90b and the pressing portion 90c provided on the other supporting portion 90b may be separated or may be composed of two members at a predetermined position on the core 20. According to this, as compared with the fourth embodiment, it becomes easier to adjust the pressing force of the pressing portion 20b with respect to the core 20, and the manufacturing process can be simplified.

Sixth Embodiment

A sixth embodiment will be described. In this embodiment, the configuration of a portion of the printed circuit board 1 on which the fastening member 60 is arranged is adjusted with respect to the first embodiment. Descriptions of the same configurations and processes as those of the first embodiment will not be repeated hereinafter.

Figure 15:
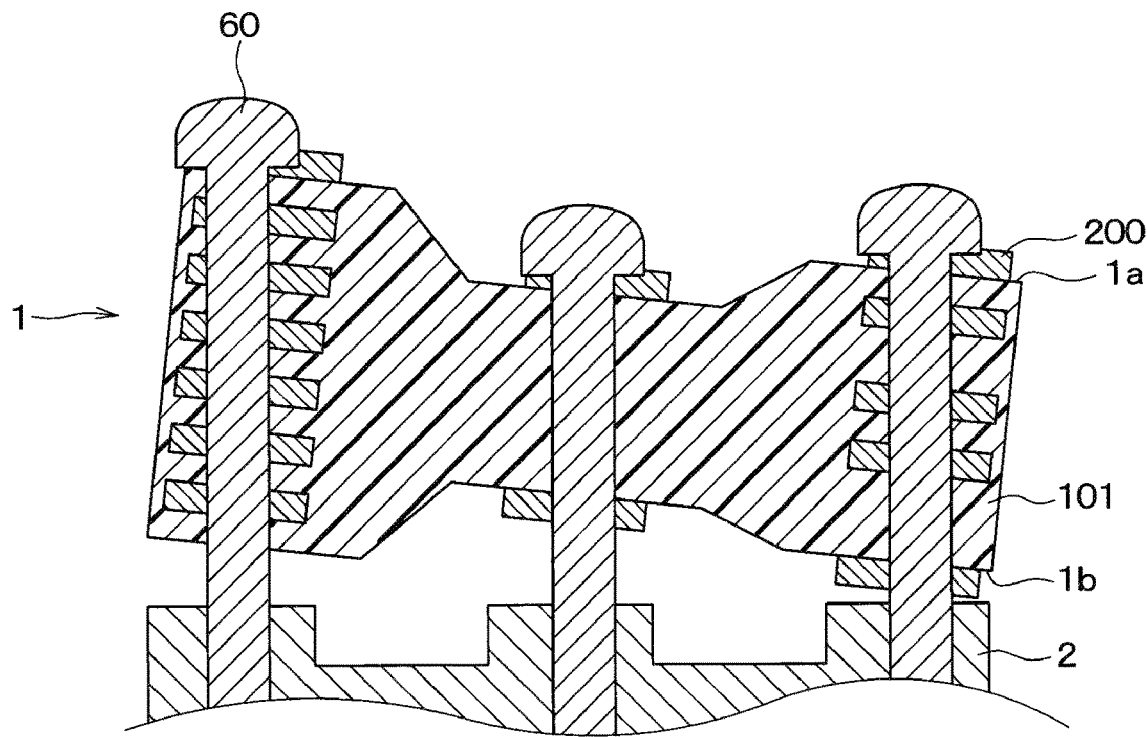
FIG. 15 is a diagram for explaining an issue that may occur when a printed circuit board is fixed on a housing.

In the first embodiment, the outer periphery portion of the printed circuit board 1 is fixed to the housing 2 via the fastening member 60, and the transformer configuration region 10 is fixed to the housing 2 via the fastening member 60. That is, the printed circuit board 1 is fixed to the housing 2 at plural places via the fastening member 60. In this case, as shown in FIG. 15, if the total thickness of the wiring 200 at the position where the fastening member 60 is arranged is different, the printed circuit board 1 cannot be uniformly fastened to the housing 2. In this case, the printed circuit board 1 may be tilted with respect to the surface direction of the housing 2. If the printed circuit board 1 is tilted with respect to the surface direction of the housing 2, the heat radiating from the printed circuit board 1 to the housing 2 may decrease. In this embodiment, the wiring 200 is a general term for various wirings including the signal wiring 100 and the heat radiating wiring 150.

Figure 16:
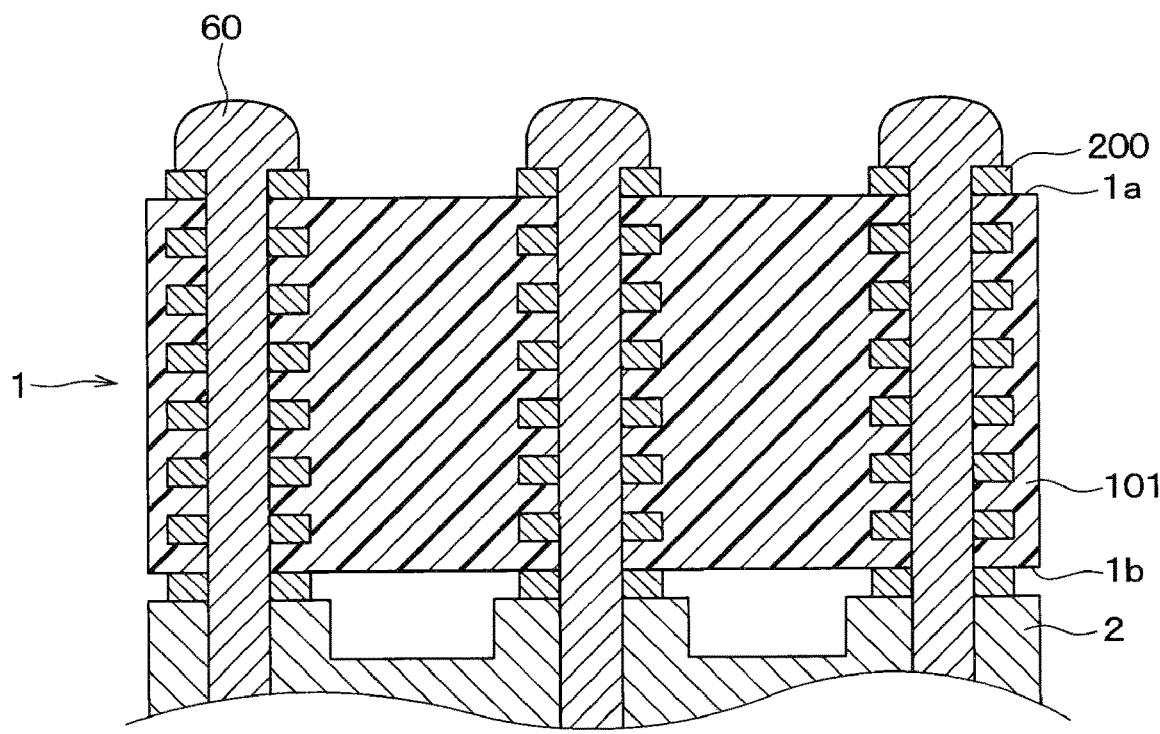
FIG. 16 is a schematic cross-sectional view of a power conversion device according to a sixth embodiment.

Therefore, in the present embodiment, as shown in FIG. 16, the total thickness of the wiring 200 at the portion where the fastening member 60 is arranged is set to be the same. Thereby, in the present embodiment, the printed circuit board 1 can be uniformly fastened to the housing 2, and the printed circuit board 1 can be prevented from tilting with respect to the surface direction of the housing 2. The wiring 200 where the fastening member 60 is arranged may be only the signal wiring 100, may be only the heat radiating wiring 150, or may be a combination of the signal wiring 100 and the heat radiating wiring 150. Further, the wiring 200 may be a dummy wiring for ensuring the thickness, and the use is not particularly limited.

According to the present embodiment, since the heat radiating wiring 150 is arranged on the same plane as the windings 111, 121, 131, 141, the same effect as that of the first embodiment can be obtained.

(1) In the present embodiment, the total thickness of the wiring 200 at the portion where the fastening member 60 is arranged is the same. Therefore, the printed circuit board 1 can be uniformly fastened to the housing 2, and the printed circuit board 1 can be prevented from tilting with respect to the surface direction of the housing 2. Therefore, it is possible to suppress a decrease in heat radiating from the printed circuit board 1 to the housing 2.

Modification of Sixth Embodiment

Figure 17:
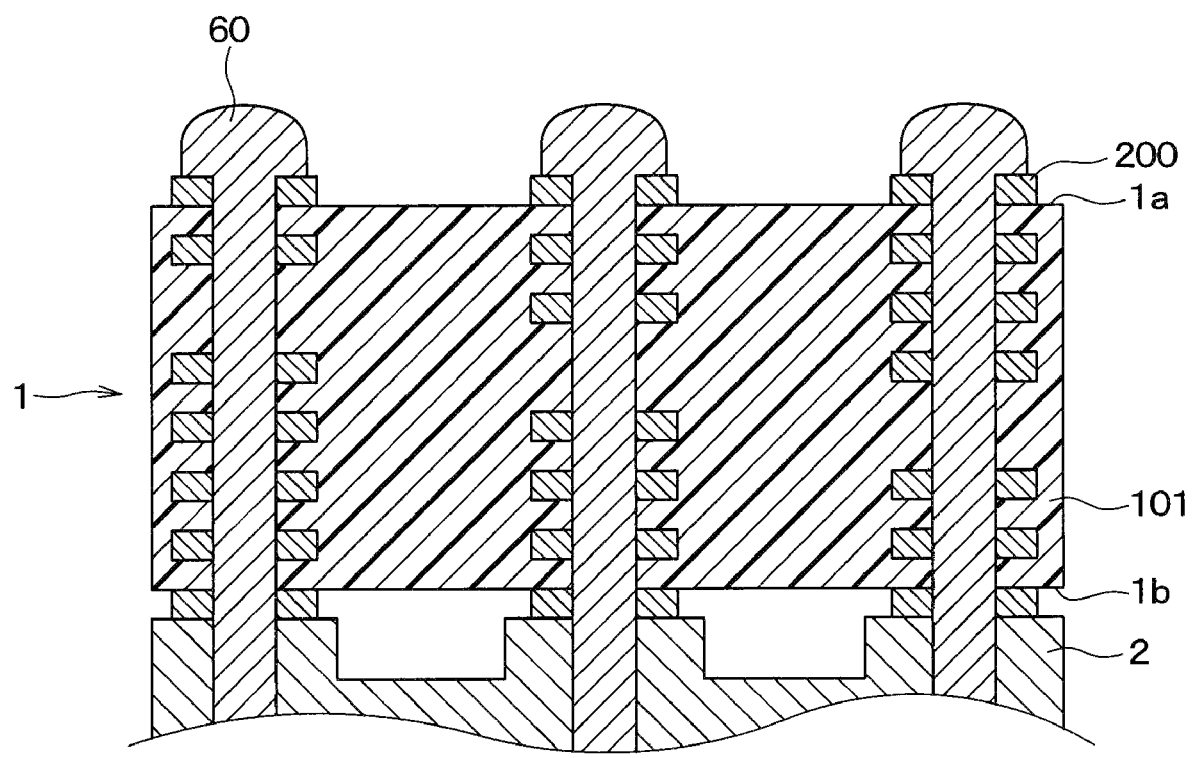
FIG. 17 is a schematic cross-sectional view of a power conversion device according to a modification of the sixth embodiment.

A modification of the sixth embodiment will be described. In the sixth embodiment, if the thicknesses of the wiring 200 at the portion where the fastening member 60 is arranged is the same, as shown in FIG. 17, the wiring 200 may be formed in different layers. That is, if the total thickness of the wiring 200 is the same in the portion where the fastening member 60 is arranged, the layer on which the wiring 200 is formed can be appropriately changed.

Seventh Embodiment

A seventh embodiment will be described. In this embodiment, the configuration of the first constituent layer 110 is changed from that of the first embodiment. Descriptions of the same configurations and processes as those of the first embodiment will not be repeated hereinafter.

Figure 18:
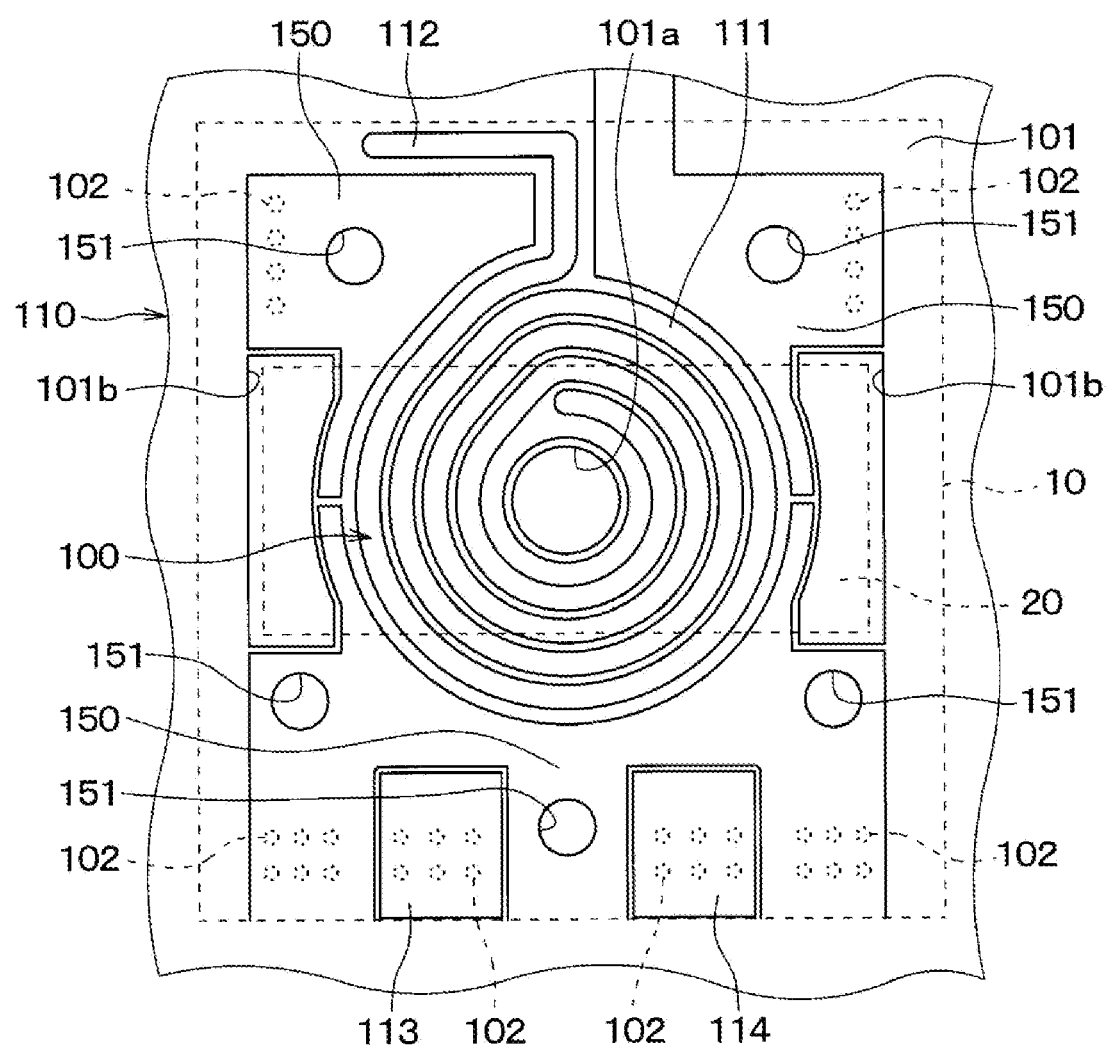
FIG. 18 is a plan view of a first constituent layer in a seventh embodiment.

In the power conversion device of the present embodiment, as shown in FIG. 18, a part of the heat radiating wiring 150 in the first constituent layer 110 is led to the outside of the transformer configuration region 10. In FIG. 18, the heat radiating wiring 150 on the upper right of the paper surface is led out to the outside of the transformer configuration region 10. Then, the heat radiating wiring 150 is used as a ground wiring for another electronic component or the like arranged on the printed circuit board 1. That is, the heat radiating wiring 150 is connected to the signal wiring 100 outside the transformer configuration region 10.

According to the present embodiment, since the heat radiating wiring 150 is arranged on the same plane as the windings 111, 121, 131, 141, the same effect as that of the first embodiment can be obtained.

(1) In the present embodiment, the heat radiating wiring 150 connected to the housing 2 is connected to the signal wiring 100 outside the transformer configuration region 10. That is, the heat radiating wiring 150 connected to the housing 2 is used to maintain the signal wiring 100 outside the transformer configuration region 10 at the ground potential. Therefore, the heat radiating wiring 150 can be used more effectively.

Modification of Seventh Embodiment

A modification of the seventh embodiment will be described. In the seventh embodiment, the heat radiating wiring 150 in the second to fourth constituent layers 120, 130, 140 may be connected to the signal wiring 100 outside the transformer configuration region 10.

Eighth Embodiment

An eighth embodiment will be described hereafter. In this embodiment, the configuration of the transformer configuration region 10 is changed from that of the first embodiment. Descriptions of the same configurations and processes as those of the first embodiment will not be repeated hereinafter.

Figure 19:
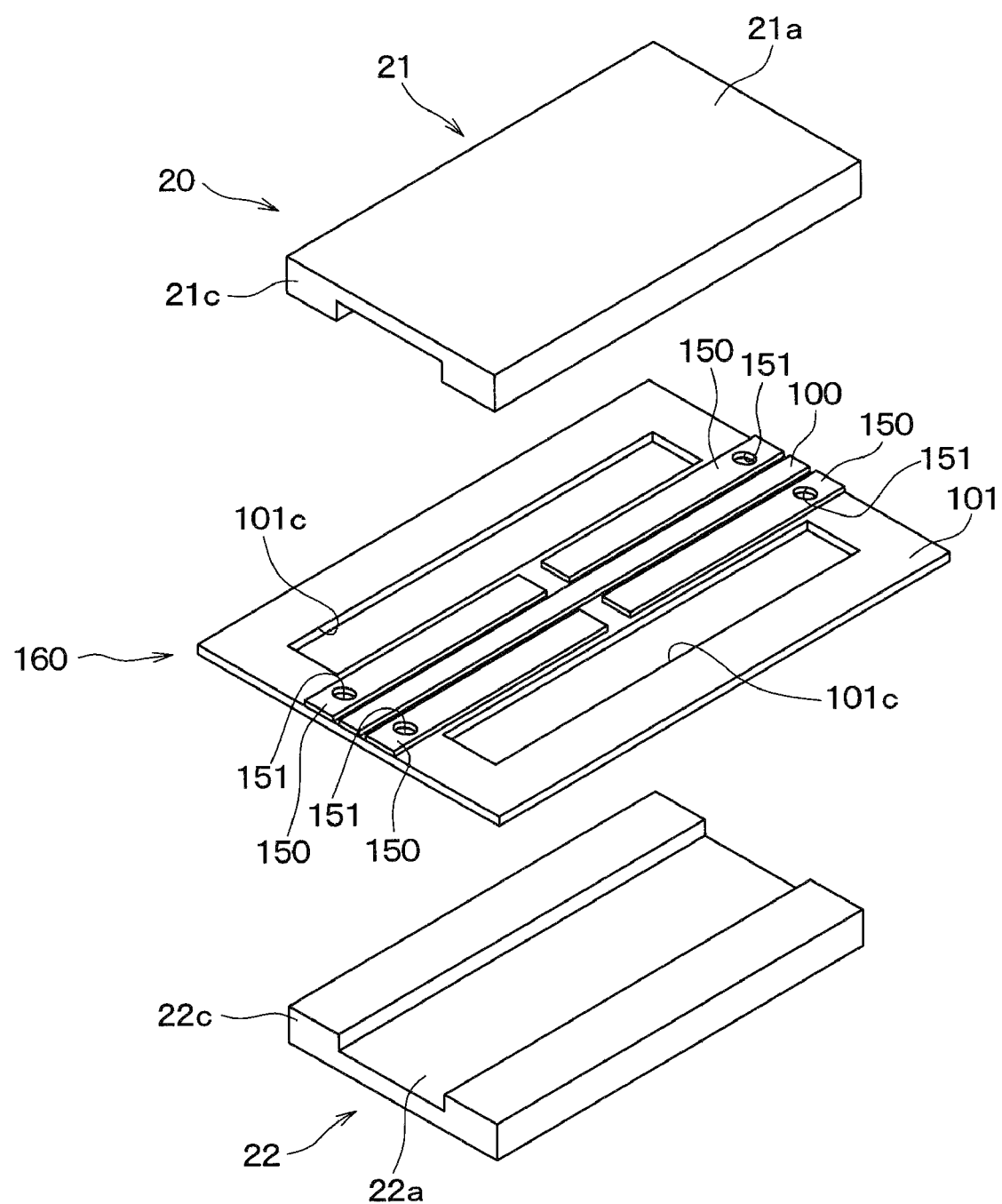
FIG. 19 is an exploded perspective view of a transformer configuration region according to an eighth embodiment.

In the power conversion device of the present embodiment, as shown in FIG. 19, the transformer configuration region 10 has a constituent layer 160 in which a signal wiring 100 formed on the insulating layer 101 function as a wiring for a coil. Specifically, the constituent layer 160 of the present embodiment has a rectangular shape with one direction as the longitudinal direction. The signal wiring 100 passes through the substantially center of the constituent layer 160 and is formed in a straight line along the longitudinal direction.

Further, two through holes 101c are formed in the insulating layer 101, and the signal wiring 100 is interposed between the two through holes 101c. The through hole 101c is formed at a position and size into which the leg 21c, 22c of the first core 21 or the second core 22 can be inserted.

In the present embodiment, the first core 21 has the base portion 21a and a pair of outer legs 21c extending from the base portion 21a, and the second core 22 has the base portion 22a and a pair of outer legs 22c extending from the base portion 22a. The base portion 21a, 22a has a flat plate shape with one direction as the longitudinal direction. The pair of outer legs 21c, 22c are formed so as to project in the normal direction with respect to the surface direction of the base portion 21a, 22a at both ends in the lateral direction orthogonal to the longitudinal direction of the base portion 21a, 22a. That is, each of the first core 21 and the second core 22 of the present embodiment is so-called U-shaped core.

The first and second cores 21 and 22 are arranged to face each other so that the outer leg 21c, 22c is inserted into the through hole 101c. That is, the power conversion device of the present embodiment is configured to have a choke coil.

Further, on the insulating layer 101, a heat radiating wiring 150 that is thermally connected to the signal wiring 100 is formed around the signal wiring 100. The heat radiating wiring 150 has a fastening hole 151 in a portion exposed from the core 20. Although not particularly shown, the heat radiating wiring 150 is fixed to the housing 2 via the fastening member 60.

According to the present embodiment, since the heat radiating wiring 150 is arranged on the same plane as the signal wiring 100, the same effect as that of the first embodiment can be obtained.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. In addition, as the various combinations and configurations, which are preferred, other combinations and configurations, including more, less or only a single element, are also within the spirit and scope of the present disclosure.

For example, in each of the embodiments, the number of constituent layers constituting the printed circuit board 1 can be appropriately changed. In this case, the transformer configuration region 10 may include a constituent layer in which no winding is formed.

Further, in each of the embodiments, the heat radiating member 50 may not be arranged between the core 20 and the printed circuit board 1.

Figure 20:
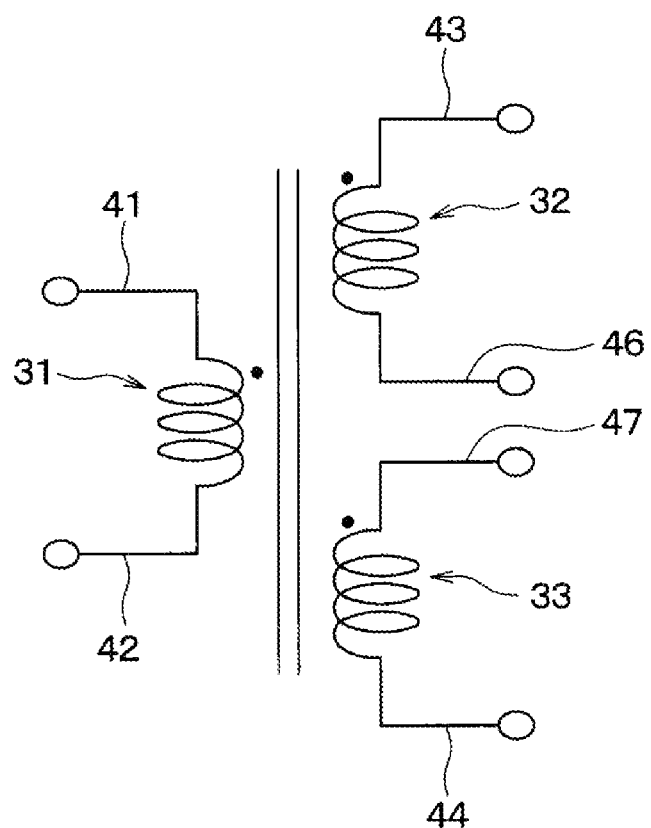
FIG. 20 is a circuit diagram of a transformer according to another embodiment.

Then, in the first to seventh embodiments, as shown in FIG. 20, the second coil 32 and the third coil 33 may not be connected in series, as the transformer T. That is, the sixth connection wire 46 may be connected to an end of the second coil 32 opposite to the third connection wire 43, and the seventh connection wire 47 may be connected to an end of the third coil 33 opposite to the fourth connection wire 44. In this case, the fifth lead-out wiring 123 in the second constituent layer 120 constitutes the sixth connection wire 46, and the fifth lead-out wiring 133 in the third constituent layer 130 constitutes the seventh connection wire 47. Although not particularly shown, the place where the fastening member 60 is arranged is changed so that the fifth lead-out wiring 123 of the second constituent layer 120 and the fifth lead-out wiring 133 of the second constituent layer 130 are not electrically connected. Thus, the transformer T of FIG. 20 is configured.

Further, in the first to seventh embodiments, the heat radiating wiring 150 may be divided not at a portion overlapping with the core 20 but at a portion exposed from the core 20 in the normal direction. Further, the heat radiating wiring 150 may be further divided by plural virtual lines K. That is, if the heat radiating wiring 150 does not function as a coil, the division position and the division method can be appropriately changed.

Further, in each of the embodiments, the electronic device may not include the core 20. Even in such an electronic device, heat radiating can be improved by arranging the heat radiating wiring 150 that is thermally connected to the signal wiring 100 on the same plane as the signal wiring 100.

In the fourth embodiment, the electronic device may include only one of the one-side heat radiating member 81 and the other-side heat radiating member 82. When only the other-side heat radiating member 82 is provided, the pressing member 90 may not be arranged.

The above embodiments may be combined as appropriate. For example, the fourth embodiment may be combined with each embodiment to include the one-side heat radiating member 81 and the other-side heat radiating member 82. In this case, the pressing member 90 may be provided with the pressing portion 90c as in the fifth embodiment. Further, the sixth embodiment may be combined with each embodiment so that the total thickness of the wiring 200 at the portion where the fastening member 60 is arranged is the same as each other. The seventh embodiment may be combined with each embodiment, and the heat radiating wiring 150 may be connected to the signal wiring 100 outside the transformer configuration region 10.

What is claimed is:
1. An electronic device comprising:
a substrate having one surface and the other surface opposite to the one surface;
a signal wiring formed on an insulating layer of the substrate; and
a heat radiating wiring formed on the insulating layer and thermally connected to the signal wiring on a same plane as the signal wiring,
wherein
the substrate has a through hole penetrating in a thickness direction,
a core forming a closed magnetic path is arranged at a position including the through hole,
the substrate is a multilayer substrate in which a plurality of constituent layers are stacked,
the signal wiring includes a winding arranged around the through hole and a lead-out wiring connected to the winding in at least two of the plurality of constituent layers,
the winding has one end connected to a first end lead-out wiring and the other end connected to a second end lead-out wiring in at least one of the at least two of the plurality of constituent layers, and
the second end lead-out wiring is electrically connected to a housing made of a conductive material via a fastening member and is connected to the heat radiating wiring.

2. The electronic device according to claim 1, wherein the substrate is fixed on a housing made of a conductive material via a fastening member that is thermally connected to the heat radiating wiring.

3. The electronic device according to claim 1, wherein a heat radiating member is arranged between the substrate and the core.

4. The electronic device according to claim 1, wherein the winding is located on both sides of the core in a normal direction with respect to a surface direction of the substrate, the heat radiating wiring is formed at a position including a periphery of the winding located on the both sides of the core in the normal direction, and the heat radiating wiring is divided into a region located on one side of the core and a region located on the other side of the core with respect to a virtual line passing through the winding and extending along one direction in the surface direction of the substrate.

5. The electronic device according to claim 4, wherein the heat radiating wiring is divided into a region located on one side of the core and a region located on the other side of the core at a portion overlapping the core in the normal direction.

6. The electronic device according to claim 1, wherein a connection area connecting the winding and the second end lead-out wiring is larger than a connection area connecting the winding and the first end lead-out wiring.

7. The electronic device according to claim 1, wherein the substrate is arranged so that the other surface faces a housing made of a conductive material, and a heat radiating member thermally connected to the signal wiring is arranged on at least one of the one surface and the other surface of the substrate.

8. The electronic device according to claim 7, wherein the heat radiating member is arranged on the one surface of the substrate, a pressing member is arranged on the heat radiating member, the substrate has a through hole penetrating in a thickness direction, a core forming a closed magnetic path is arranged at a position including the through hole, and the pressing member has a supporting portion arranged on the heat radiating member and a pressing portion integrally formed with the supporting portion to press the core.

9. The electronic device according to claim 1, wherein the substrate is fixed on a housing at a plurality of locations via a fastening member, and a total thickness of a wiring including the signal wiring and the heat radiating wiring is a same among portions of the substrate pressed by the fastening member.

10. The electronic device according to claim 1, wherein the substrate has a transformer configuration region in which the signal wiring and the heat radiating wiring are formed, and the heat radiating wiring is electrically connected to a housing made of a conductive material and is connected to a wiring outside the transformer configuration region.

11. The electronic device according to claim 1, wherein the heat radiating wiring is divided into a plurality of regions in a normal direction with respect to a surface direction of the substrate, and the heat radiating wiring is divided into a region located on one side of the core and a region located on the other side of the core with respect to a virtual line passing through the winding and extending along one direction in the surface direction of the substrate.

* * * * *